US012776467B2

(12) United States Patent
Kimura et al.

(10) Patent No.: US 12,776,467 B2
(45) Date of Patent: Oct. 27, 2026

(54) BLANKING APERTURE ARRAY MECHANISM AND WRITING APPARATUS

(71) Applicant: NuFlare Technology, Inc., Yokohama (JP)

(72) Inventors: Toshiki Kimura, Yokohama (JP); Yuichi Baba, Yokohama (JP); Hirofumi Morita, Setagaya-ku (JP)

(73) Assignee: NuFlare Technology, Inc., Yokohama (JP)

( * ) Notice: Subject to any disclaimer, the term of this patent is extended or adjusted under 35 U.S.C. 154(b) by 224 days.

(21) Appl. No.: 18/653,062

(22) Filed: May 2, 2024

(65) Prior Publication Data

US 2024/0395493 A1 Nov. 28, 2024

(30) Foreign Application Priority Data

May 24, 2023 (JP) ................................ 2023-085390

(51) Int. Cl.
*H01J 37/04* (2006.01)
*H01J 37/317* (2006.01)

(52) U.S. Cl.
CPC ........ *H01J 37/045* (2013.01); *H01J 37/3174* (2013.01); *H01J 2237/0435* (2013.01)

(58) Field of Classification Search
CPC ................ H01J 37/045; H01J 37/3174; H01J 2237/0435; H01J 2237/0437; H01J 37/3177; H01J 37/10; H01J 37/1471; H01J 37/20
See application file for complete search history.

(56) References Cited

U.S. PATENT DOCUMENTS

| | | | | |
|---|---|---|---|---|
| 5,981,954 | A * | 11/1999 | Muraki | B82Y 40/00 250/397 |
| 6,107,636 | A * | 8/2000 | Muraki | H01J 37/3174 250/398 |
| 10,042,261 | B2 * | 8/2018 | Nanao | G03F 7/2059 |
| 10,636,616 | B2 * | 4/2020 | Iizuka | H01J 37/045 |
| 11,145,489 | B2 * | 10/2021 | Matsumoto | H01J 37/09 |

(Continued)

FOREIGN PATENT DOCUMENTS

| | | | |
|---|---|---|---|
| JP | 2003-173755 | A | 6/2003 |
| JP | 2022-190668 | A | 12/2022 |
| JP | 2024-8831 | A | 1/2024 |

OTHER PUBLICATIONS

Korean Notice of Allowance issued Jan. 13, 2026 in Korean Patent Application No. 10-2024-0058392 (with unedited computer-generated English translation), 5 pages.

*Primary Examiner* — David A Vanore
(74) *Attorney, Agent, or Firm* — Oblon, McClelland, Maier & Neustadt, L.L.P.

(57) ABSTRACT

A blanking aperture array mechanism includes a blanking aperture array chip configured to include a plurality of blankers which, at incidence of multiple beams, individually switch a state between "beam ON" and "beam OFF" of the multiple beams, and a mounting substrate configured to support the blanking aperture array chip, and to include a power supply plane which supplies power to the blanking aperture array chip, and a cancelling layer, arranged at one of an upper layer side and a lower layer side of the power supply plane in a manner overlapping with the power supply plane, to cancel out a magnetic field generated by the power supply plane.

10 Claims, 16 Drawing Sheets

(56) References Cited

U.S. PATENT DOCUMENTS

2001/0028038 A1* 10/2001 Hamaguchi ............ B82Y 10/00
250/396 ML
2002/0121615 A1* 9/2002 Nakasuji ................ B82Y 40/00
250/396 ML
2003/0209674 A1* 11/2003 Hamaguchi ............ B82Y 40/00
250/398
2007/0132320 A1 6/2007 Uchida
2015/0136994 A1* 5/2015 Van De Peut ...... H01J 37/3177
250/396 R
2015/0255249 A1* 9/2015 Ogasawara ......... H01J 37/3177
250/396 R
2018/0040453 A1* 2/2018 Nanao ................. H01J 37/3177
2018/0166248 A1* 6/2018 Ogasawara ......... H01J 37/3177
2018/0182593 A1* 6/2018 Matsumoto ............. H01J 37/09
2018/0247788 A1* 8/2018 Fujisaki ................ H01J 37/045
2018/0261424 A1* 9/2018 Tsuchiya ................. H01J 37/28
2018/0356737 A1* 12/2018 Shibazaki ........... G03F 7/70725
2018/0358203 A1* 12/2018 Morita ................ H01J 37/1471
2019/0035603 A1* 1/2019 Iizuka ................... H01J 37/304
2019/0051487 A1* 2/2019 Ogasawara ......... H01J 37/3177
2019/0051494 A1* 2/2019 Yamashita .......... H01J 37/3177
2019/0355546 A1* 11/2019 Ando .................... H01J 37/141
2019/0360951 A1* 11/2019 Ogawa ................... G01N 23/04
2019/0362928 A1* 11/2019 Inoue .................... H01J 37/153
2020/0176216 A1* 6/2020 Inoue ...................... H01J 37/20
2020/0328060 A1* 10/2020 Iizuka ................. H01J 37/3026
2020/0343073 A1* 10/2020 Okazawa ............ H01J 37/3177
2020/0395189 A1* 12/2020 Inoue ...................... H01J 37/09
2020/0395191 A1* 12/2020 Hashimoto ........... H01J 37/244
2021/0257185 A1* 8/2021 Matsumoto ............. H01J 37/24
2022/0399181 A1* 12/2022 Kimura ................... H01J 37/09
2023/0078311 A1* 3/2023 Yamada .............. H01J 37/3045
355/67
2023/0091222 A1* 3/2023 Maekawa ............... H01J 37/20
250/310
2024/0013999 A1 1/2024 Kimura et al.
2024/0029999 A1* 1/2024 Yamashita ............ H01J 37/045
2024/0186100 A1* 6/2024 Yoshino ................ G03F 7/2059
2024/0242920 A1* 7/2024 Morita .................... H01J 37/21
2024/0242922 A1* 7/2024 Morita .................. H01J 37/145
2024/0242933 A1* 7/2024 Morita .................. H01J 37/045
2024/0395493 A1* 11/2024 Kumura .............. H01J 37/3174
2025/0336640 A1* 10/2025 Hayasaka ............. H01J 37/045

* cited by examiner

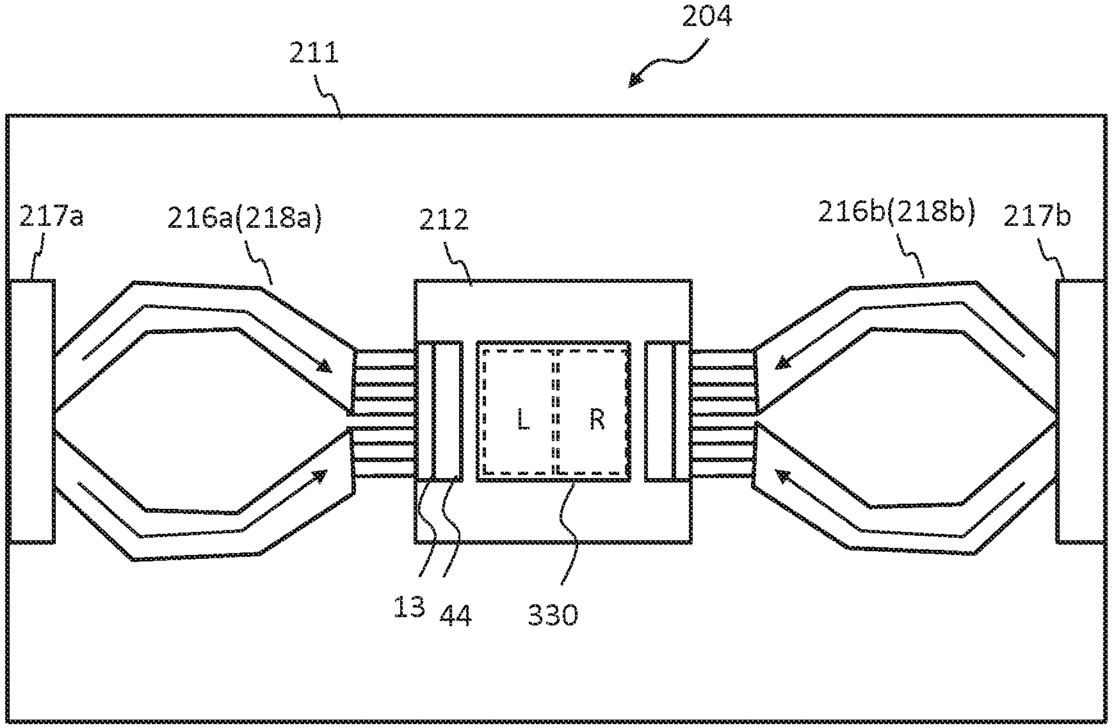
FIG.13
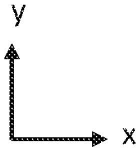

BLANKING APERTURE ARRAY MECHANISM AND WRITING APPARATUS

CROSS-REFERENCE TO RELATED APPLICATION

This application is based upon and claims the benefit of priority from prior Japanese Patent Application No. 2023-085390 filed on May 24, 2023 in Japan, the entire contents of which are incorporated herein by reference.

BACKGROUND OF THE INVENTION

Field of the Invention

Embodiments of the present invention relate to a blanking aperture array mechanism and a writing apparatus, and for example, to a method of cancelling out the magnetic field which affects the trajectory of multiple beams.

Description of Related Art

The lithography technique which advances miniaturization of semiconductor devices is extremely important as a unique process whereby patterns are formed in semiconductor manufacturing. In recent years, with high integration of LSI, the line width (critical dimension) required for semiconductor device circuits is becoming increasingly finer year by year. The electron beam writing technique, which intrinsically has excellent resolution, is used for writing or "drawing" on a wafer and the like with electron beams.

For example, as a known example of employing the electron beam writing technique, there is a writing apparatus using multiple beams. Since it is possible for multiple beam writing to apply multiple beams at a time, the writing throughput can be greatly increased in comparison with single electron beam writing. For example, a writing apparatus employing the multiple beam system forms multiple beams by letting an electron beam emitted from an electron gun pass through a mask having a plurality of holes, performs blanking control for each beam, reduces each unblocked beam by an optical system, and deflects it by a deflector to irradiate a desired position on a target object or "sample".

In the multiple beam writing, a pattern is formed by individually controlling the irradiation time of electron beams entering a target object. Accordingly, in the writing apparatus, there is installed a mounting substrate (board) where a blanking aperture array chip is arrayed having a plurality of blanker functions for controlling a beam to be OFF whose irradiation time is zero or desired irradiation time has passed.

It has turned out that positional deviation of an electron beam passing through a blanking aperture array chip occurs due to a magnetic field generated by circuit currents flowing in the mounting substrate. The writing accuracy is degraded if such positional deviation occurs.

Although not relating to a magnetic field generated by a mounting substrate in an electron optical column, there is disclosed a technique in which cancel coils are disposed around an electron optical column in order to measure a disturbing magnetic field outside the electron optical column, and then, the disturbing magnetic field is cancelled out by generating a reverse magnetic field by the cancel coils (e.g., refer to Japanese Patent Application Laid-open (JP-A) No. 2003-173755).

BRIEF SUMMARY OF THE INVENTION

According to one aspect of the present invention, a blanking aperture array mechanism includes

- a blanking aperture array chip configured to include a plurality of blankers which, at incidence of multiple beams, individually switch a state between "beam ON" and "beam OFF" of the multiple beams; and
- a mounting substrate configured to support the blanking aperture array chip, and to include
  - a power supply plane configured to supply power to the blanking aperture array chip, and
  - a cancelling layer arranged at one of an upper layer side and a lower layer side of the power supply plane in a manner overlapping with the power supply plane, and configured to cancel out a magnetic field generated by the power supply plane.

According to another aspect of the present invention, a blanking aperture array mechanism includes

- a blanking aperture array chip configured to include a plurality of blankers which, at incidence of multiple beams, individually switch a state between "beam ON" and "beam OFF" of the multiple beams; and
- a mounting substrate configured to support the blanking aperture array chip and to include
  - a power supply plane configured to supply power to the blanking aperture array chip, and
  - a plurality of correction coils arranged at one of an upper layer side and a lower layer side of the power supply plane and near the blanking aperture array chip, and configured to correct positional deviation of the multiple beams.

According to yet another aspect of the present invention, a writing apparatus includes

- a stage configured to mount thereon a target object to be written,
- a blanking aperture array mechanism described above,
- a limiting aperture substrate configured to block a beam in an OFF state in multiple beams having passed through the blanking aperture array mechanism, and
- an objective lens configured to lead the multiple beams having passed through the limiting aperture substrate to the target object.

BRIEF DESCRIPTION OF THE DRAWINGS

FIG. 13 is a top view of another example of a blanking aperture array mechanism according to the first embodiment;

DETAILED DESCRIPTION OF THE INVENTION

Embodiments below provide an apparatus which can cancel out a magnetic field generated by circuit currents flowing in a mounting substrate where a blanking aperture array chip through which multiple beams pass is disposed. Further, embodiments provide an apparatus which can correct positional deviation of an electron beam resulting from the magnetic field.

Embodiments below describe a configuration in which an electron beam is used as an example of a charged particle beam. The charged particle beam is not limited to the electron beam, and other charged particle beam such as an ion beam may also be used.

First Embodiment

Figure 1:
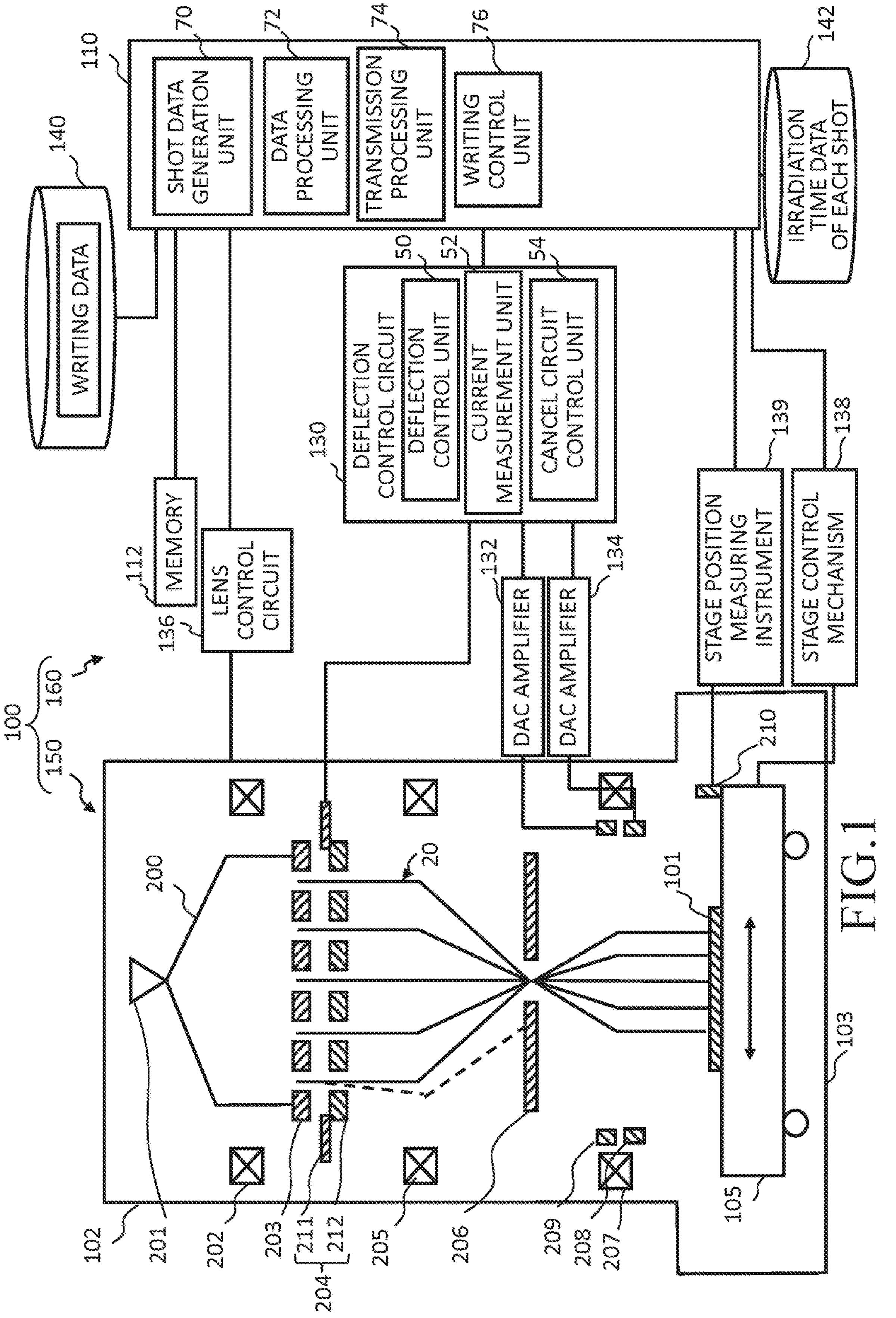
FIG. 1 is a schematic diagram showing a configuration of a writing apparatus according to a first embodiment.

FIG. 1 is a schematic diagram showing a configuration of a writing or "drawing" apparatus according to a first embodiment. As shown in FIG. 1, a writing apparatus 100 includes a writing mechanism 150 and a control system circuit 160. The writing apparatus 100 is an example of a multiple charged particle beam writing apparatus and a multiple charged particle beam exposure apparatus. The writing mechanism 150 includes an electron optical column 102 (electron beam column) and a writing chamber 103. In the electron optical column 102, there are disposed an electron gun 201, an illumination lens 202, a shaping aperture array substrate 203, a blanking aperture array mechanism 204, a reducing lens 205, a limiting aperture substrate 206, an objective lens 207, a deflector 208, and a deflector 209.

The blanking aperture array mechanism 204 includes a mounting substrate 211 and a blanking aperture array chip 212. Openings through which all of multiple beams 20 can pass are formed in the central portion of the mounting substrate 211. The blanking aperture array chip 212 is hung from the mounting substrate 211 such that it occludes the opening. In other words, the outer peripheral part of the blanking aperture array chip 212 is arranged being supported by the mounting substrate 211. The blanking aperture array chip 212 may be arranged on the mounting substrate 211.

In the writing chamber 103, an XY stage 105 is disposed. On the XY stage 105, there is placed a target object or "sample" 101 such as a mask serving as a writing target substrate when writing (exposure) is performed. The target object 101 is, for example, an exposure mask used when fabricating semiconductor devices, or a semiconductor substrate (silicon wafer) for fabricating semiconductor devices. The target object 101 may be, for example, a mask blank on which resist has been applied and nothing has yet been written.

On the XY stage 105, a mirror 210 for measuring the position of the XY stage 105 is placed.

The control system circuit 160 includes a control computer 110, a memory 112, a deflection control circuit 130, digital-analog converter (DAC) amplifier units 132 and 134, a lens control circuit 136, a stage control mechanism 138, a stage position measuring instrument 139, and storage devices 140 and 142 such as magnetic disk drives. The control computer 110, the memory 112, the deflection control circuit 130, the lens control circuit 136, the stage control mechanism 138, the stage position measuring instrument 139, and the storage devices 140 and 142 are connected to each other through a bus (not shown). The DAC amplifier units 132 and 134 and the blanking aperture array mechanism 204 are connected to the deflection control circuit 130. The deflector 209 is composed of at least four electrodes (or "four poles"), and controlled by the deflection control circuit 130 through the DAC amplifier unit 132 disposed for each electrode. The deflector 208 is composed of at least four electrodes (or "four poles"), and controlled by the deflection control circuit 130 through the DAC amplifier unit 134 disposed for each electrode. Electromagnetic lenses such as the illumination lens 202, the reducing lens 205, and the objective lens 207 are controlled by the lens control circuit 136.

The position of the XY stage 105 is controlled by the drive of each axis motor (not shown) which is controlled by the stage control mechanism 138. Based on the principle of laser interferometry, the stage position measuring instrument 139 measures the position of the XY stage 105 by receiving a reflected light from the mirror 210.

In the control computer 110, there are arranged a shot data generation unit 70, a data processing unit 72, a transmission processing unit 74, and a writing control unit 76. Each of the "... units" such as the shot data generation unit 70, the data processing unit 72, the transmission processing unit 74, and the writing control unit 76 includes processing circuitry. The processing circuitry includes, for example, an electric circuit, computer, processor, circuit board, quantum circuit, semiconductor device, or the like. Each "... unit" may use common processing circuitry (the same processing circuitry), or different processing circuitry (separate processing circuitry). Information input/output to/from the shot data generation unit 70, the data processing unit 72, the transmission processing unit 74, and the writing control unit 76, and information being operated are stored in the memory 112 each time.

In the deflection control circuit 130, there are arranged a deflection control unit 50, a current measurement unit 52, and a cancel circuit control unit 54 are arranged. Each of the "... units" such as the deflection control unit 50, the current measurement unit 52, and the cancel circuit control unit 54 includes processing circuitry. The processing circuitry includes, for example, an electric circuit, computer, processor, circuit board, quantum circuit, semiconductor device, or the like. Each " . . . unit" may use common processing circuitry (the same processing circuitry), or different processing circuitry (separate processing circuitry). Information input/output to/from the deflection control unit 50, the current measurement unit 52, and the cancel circuit control unit 54, and information being operated are stored in a memory (not shown) in the deflection control circuit 130 each time.

Writing operations of the writing apparatus 100 are controlled by the writing control unit 76. Processing of transmitting irradiation time data of each shot to the deflection control circuit 130 is controlled by the transmission control unit 74.

Writing data (chip data) is input from the outside of the writing apparatus 100, and stored in the storage device 140. Chip data defines information on a plurality of figure patterns configuring a chip pattern. Specifically, for example, a figure code, coordinates, a size, and the like are defined for each figure pattern.

FIG. 1 shows a configuration necessary for describing the first embodiment. Other configuration elements generally necessary for the writing apparatus 100 may also be included therein.

Figure 2:
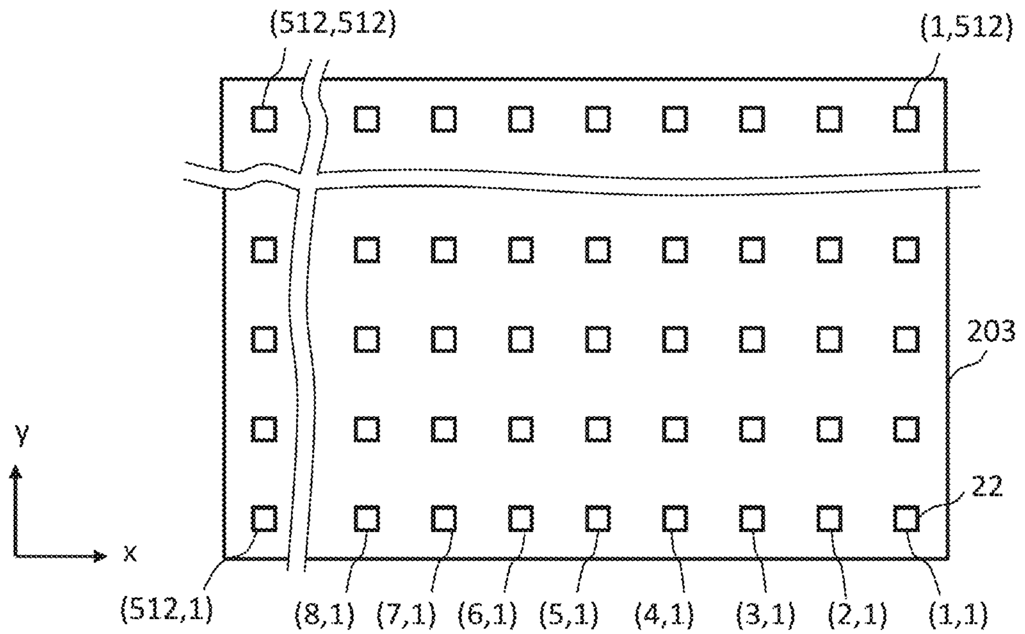
FIG.2 Background Art
FIG. 2 is a conceptual diagram showing a configuration of a shaping aperture array substrate according to the first embodiment.

FIG. 2 is a conceptual diagram showing a configuration of a shaping aperture array substrate according to the first embodiment. As shown in FIG. 2, holes (openings) 22 of p rows long (length in the y direction) and q columns wide (width in the x direction) ($p \geq 2$, $q \geq 2$) are formed, like a matrix, at a predetermined arrangement pitch in the shaping aperture array substrate 203. In the case of FIG. 2, for example, holes (openings) 22 of 512×512, that is 512 holes in the y direction and 512 holes in the x direction, are formed. The number of holes 22 is not limited thereto. For example, it is also preferable to form the holes 22 of 64×64. Each of the holes 22 is a rectangle (including square) having the same dimension and shape as each other. Alternatively, each of the holes 22 may be a circle with the same diameter as each other. The multiple beams 20 are formed by letting portions of an electron beam 200 individually pass through a corresponding one of a plurality of holes 22. In other words, the shaping aperture array substrate 203 forms and emits the multiple beams 20. The shaping aperture array substrate 203 is an example of an emission source of the multiple beams 20.

Figure 3:
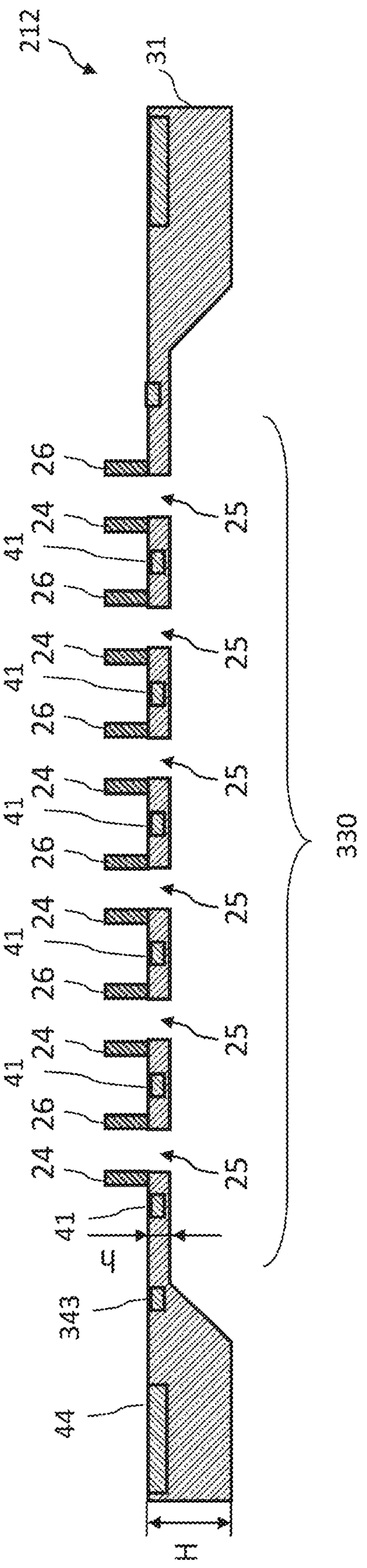
FIG.3 Background Art
FIG. 3 is a sectional view showing a configuration of a central part of a blanking aperture array mechanism according to the first embodiment.

FIG. 3 is a sectional view showing a configuration of a central part of a blanking aperture array mechanism according to the first embodiment.

Figure 4:
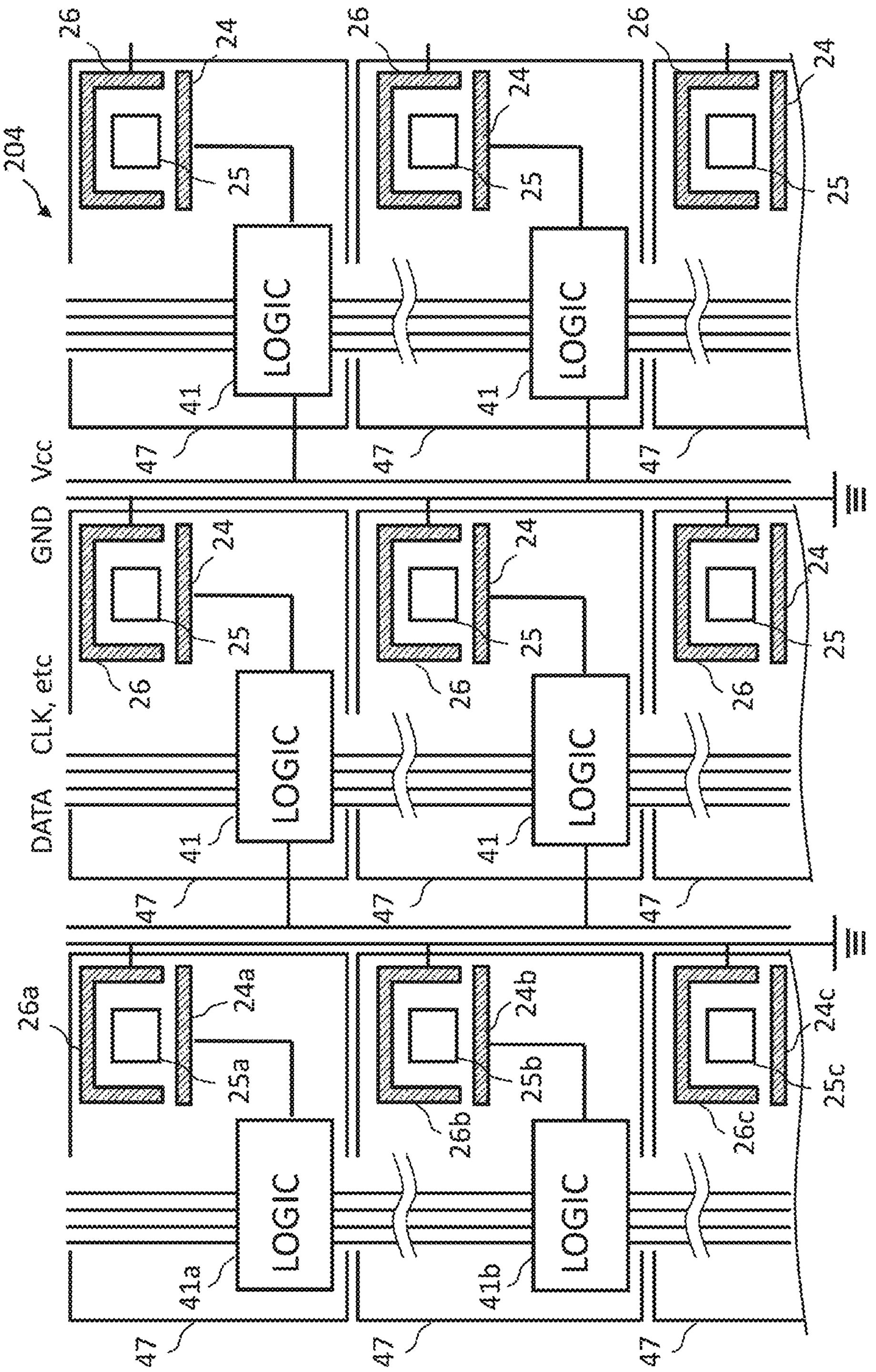
FIG. 4 Background Art
FIG. 4 is a top view conceptual diagram showing a portion of a configuration in a membrane region of a blanking aperture array chip according to the first embodiment.

FIG. 4 is a top view conceptual diagram showing a portion of a configuration in a membrane region of a blanking aperture array chip according to the first embodiment. The position relationship of a control electrode 24, a counter electrode 26, and a control circuit 41 in FIG. 3 is not in accordance with that of FIG. 4.

The blanking aperture array chip 212 includes a plurality of blankers which, at incidence of the multiple beams 20, individually switch the state between "beam ON" and "beam OFF" of the multiple beams 20. Specifically, it is configured as follows: The blanking aperture array chip 212 includes a blanking aperture substrate 31 being a semiconductor substrate made of silicon, etc. At the central part of the blanking aperture array substrate 31, a thin membrane region 330 is formed. In the membrane region 330, passage holes 25 (openings) through each of which a corresponding one of the multiple beams 20 passes are formed at positions each corresponding to each hole 22 in the shaping aperture array substrate 203 shown in FIG. 2. A pair of a control electrode 24 and a counter electrode 26 (blanker: blanking deflector) is arranged such that the electrodes 24 and 26 are opposite to each other across each corresponding one of a plurality of passage holes 25. Further, close to each passage hole 25 and inside the blanking aperture array substrate 31, there is arranged the control circuit 41 (logic circuit) which applies a deflection voltage to the control electrode 24 for each passage hole 25 concerned. The counter electrode 26 for each beam is grounded.

Further, on the blanking aperture array substrate 31 or in it, control circuits 44 are arranged in the x direction to be opposite to each other on the sides across the membrane region 330.

As shown in FIG. 4, n-bit (e.g., 1-bit) parallel lines for control signals are connected to each control circuit 41. In addition to the n-bit parallel lines for irradiation time control signals (data), lines for a clock (shift clock) signal, a load signal, a shot signal, a power supply, and the like are connected to each control circuit 41. Alternatively, a part of the parallel lines may be used as these lines. An individual blanking mechanism 47 composed of the control electrode 24, the counter electrode 26, and the control circuit 41 is configured for each beam of the multiple beams (for each passage hole 25). In the first embodiment, the shift register method is employed as a data transmission method. According to the shift register method, multiple beams are divided into a plurality of groups each composed of a plurality of beams, and a plurality of shift registers for a plurality of beams in the same group are connected in series. Specifically, a plurality of control circuits 41 formed in an array in the membrane region 330 are grouped by a predetermined pitch in the same row or the same column, for example. The control circuits 41 in the same group are connected in series as shown in FIG. 4. A signal from a pad 343 arranged for each group is transmitted to the control circuit 41 in the group.

Figure 5:
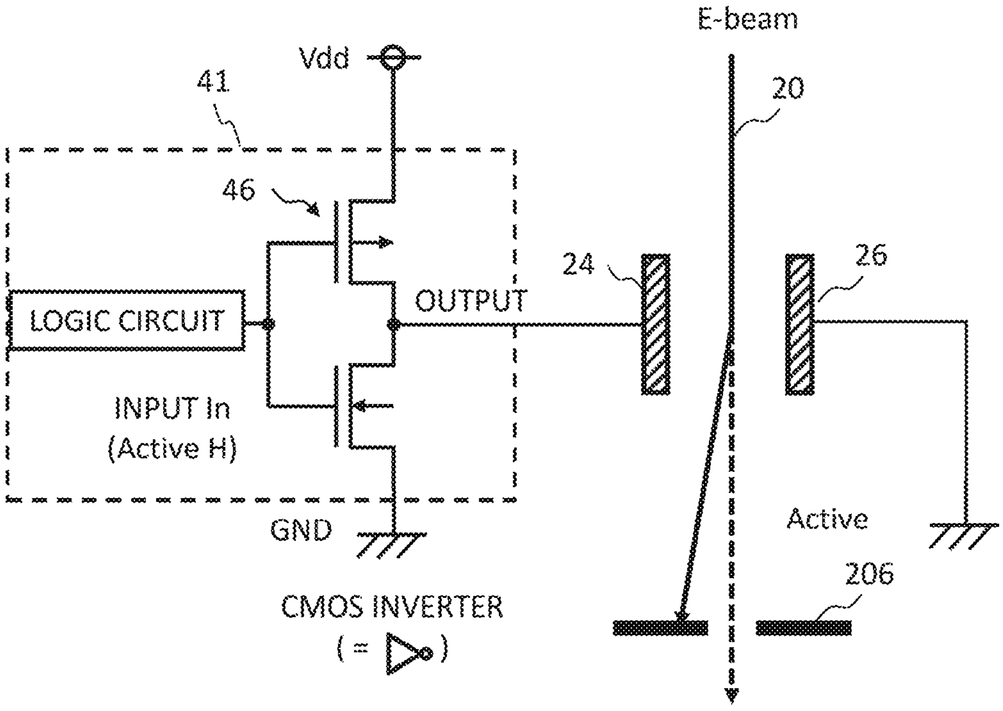
FIG.5 Background Art
FIG. 5 is a circuit diagram showing an example of an individual blanking mechanism according to the first embodiment.

FIG. 5 is a circuit diagram showing an example of an individual blanking mechanism according to the first embodiment. As shown in FIG. 5, an amplifier 46 (an example of a switching circuit) is arranged in the control circuit 41. As an example of the amplifier 46, a CMOS (complementary MOS) inverter circuit serving as a switching circuit is arranged. As an input (IN) to the CMOS inverter circuit, either an L (low) electric potential (e.g., ground potential) lower than a threshold voltage, or an H (high) electric potential (e.g., 1.5 V) higher than or equal to the threshold voltage is applied as a control signal. According to the first embodiment, in a state where an L electric potential is applied to the input (IN) of the CMOS inverter circuit, the output (OUT) of the CMOS inverter circuit to be applied to the control circuit 41 becomes a positive potential (Vdd), and then, a corresponding beam is deflected by an electric field due to a potential difference from the ground potential of the counter electrode 26 so as to be blocked by the limiting aperture substrate 206, thereby becoming in a beam OFF condition. In contrast, in a state (active state) where an H electric potential is applied to the input (IN) of the CMOS inverter circuit, the output (OUT) of the CMOS inverter circuit becomes a ground potential, and therefore, since there is no potential difference from the ground potential of the counter electrode 26, a corresponding beam is not deflected, thereby becoming in a beam ON condition by letting the beam concerned pass through the limiting aperture substrate 206. Blanking control is performed by such deflection.

Figure 6:
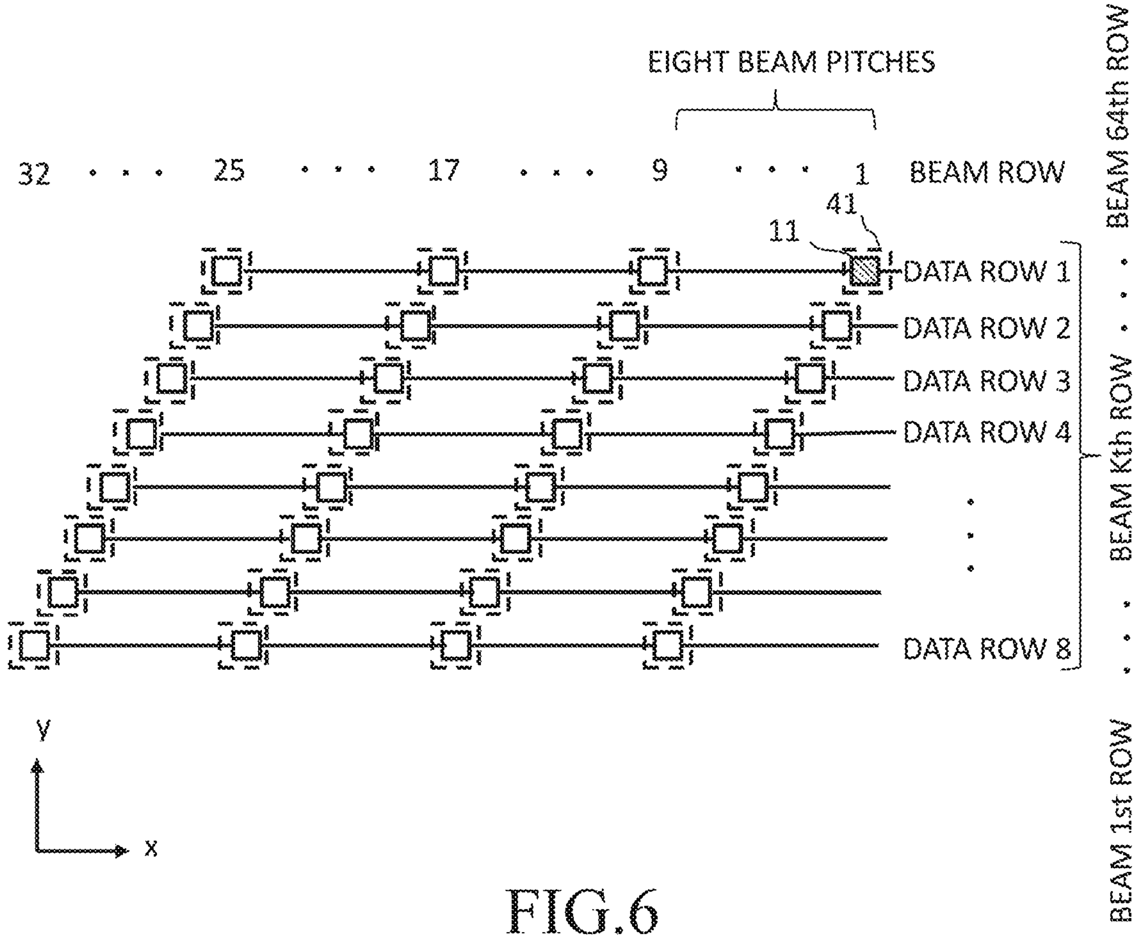
FIG.6 Background Art
FIG. 6 is an illustration showing an example of a connection configuration of a shift register according to the first embodiment.

FIG. 6 is an illustration showing an example of a connection configuration of a shift register according to the first embodiment. The control circuit 41 for each beam is formed in an array in the membrane region 330. The control circuits 41 in an array are divided into right and left halves. For example, per a plurality of control circuits 41 (arranged in the x direction) in the same row at the right half, they are distributed, in order, to eight groups as shown in FIG. 6. For example, in the case of the multiple beams 20 are configured by 64 rows×64 columns, the control circuits 41 for the 1st to 32th beams in each of the 32 rows at the right half are grouped to be a data row 1 (group) composed of control circuits 41 for the 1st, 9th, 17th, and 25th beams at every eighth beam pitch. Similarly, the control circuits 41 for the 2nd, 10th, 18th and 26th beams at every eighth beam pitch configure a data row 2 (group). In this way, a data row 3 (group) to a data row 8 (group) are configured. The control circuits 41 in each group are connected in series. The same is applied to a plurality of control circuits 41 arrayed in the left half.

Signals for each row output from the deflection control circuit 130 to the blanking aperture array mechanism 204 are divided through a circuit in the mounting substrate 211 or the control circuit 44 in the blanking aperture array chip 212, and transmitted in parallel to each group. Then, the signal for each group is transmitted to the control circuits 41 connected in series in the group concerned. Specifically, a shift register 11 is disposed in each control circuit 41, and shift registers 11 in the control circuits 41 in the same group are connected in series. In the case of FIG. 6, four shift registers 11 are connected in series in each data row (group). Therefore, when n-bit data is transmitted in series, an irradiation time control signal (ON/OFF control data) for each beam is transferred (transmitted) by 4n-time clock signals to the shift register 11 for each beam in the blanking aperture array mechanism 204. For example, in the configuration where irradiation of 512×512 multiple beams can be performed, thirty-two shift registers 11 are connected in series in each data row (group). Therefore, when n-bit data is transmitted in series, an irradiation time control signal for each beam is transferred (transmitted) by 32n-time clock signals to the shift register 11 for each beam.

Based on an irradiation time control signal transmitted to the shift register 11 for each beam, each individual blanking mechanism 47 individually controls, for each beam, the irradiation time of the shot concerned using a counter circuit (not shown). Alternatively, a maximum irradiation time Tmax for one shot is divided into a plurality of sub-shots having different irradiation time. Then, based on the irradiation time control signal transmitted to the shift register 11 for each beam, each blanking mechanism 47 selects a combination of sub-shots from the plurality of sub-shots in order that the combination may become the irradiation time for one shot. It is also preferable to control the irradiation time for one shot for each beam by continuously applying irradiation to pixels whose combinations of selected sub-shots are the same as each other. In the case of dividing one shot into a plurality of sub-shots, since the irradiation time of each sub-shot has been determined beforehand, the accuracy of irradiation time can be increased by controlling the irradiation time of each sub-shot by using a common blanking deflector controlled by a logic circuit (not shown) compared with the case of controlling by using only each individual blanking mechanism 47. In the case of individually controlling, for each beam, the irradiation time of the shot concerned by using a counter circuit, since it is not usually performed to collectively control all the beams to be beam OFF, the logic circuit and the common blanking deflector may be omitted. In the case of dividing one shot into a plurality of sub-shots, the number of irradiation time control signals to be transmitted is the same as the number of the plurality of sub-shots. At the same time, since the irradiation time control signal transmitted to the shift register 11 for each beam can be used as a signal just for selecting ON or OFF of a plurality of sub-shots, the number of bits of data used for one transmission can be reduced.

Next, an example of a concrete operation of the writing mechanism 150 will be described. The electron beam 200 emitted from the electron gun 201 (emission source) almost perpendicularly (e.g., vertically) illuminates the whole of the shaping aperture array substrate 203 by the illumination lens 202. A plurality of rectangular (including square) holes 22 (openings) are formed in the shaping aperture array substrate 203. The region including all of the plurality of holes 22 is irradiated with the electron beam 200. For example, rectangular multiple beams (a plurality of electron beams) 20 are formed by letting portions of the electron beam 200 applied to the positions of the plurality of holes 22 individually pass through a corresponding one of the plurality of holes 22 in the shaping aperture array substrate 203. The multiple beams 20 individually pass through corresponding blankers in the blanking aperture array chip 212. The blanker provides blanking control such that a corresponding beam individually passing becomes in an ON condition during a set writing time (irradiation time).

The multiple beams 20 having passed through the blanking aperture array chip 212 are reduced by the reducing lens 205, and travel toward the hole in the center of the limiting aperture substrate 206. Then, the electron beam which was deflected by the blanker of the blanking aperture array chip 212 deviates (shifts) from the hole in the center of the limiting aperture substrate 206 and is blocked by the limiting aperture substrate 206. In contrast, electron beams which were not deflected by the blankers of the blanking aperture array chip 212 pass through the hole in the center of the limiting aperture substrate 206 as shown in FIG. 1. Thus, the limiting aperture substrate 206 blocks each beam which was deflected to be in an OFF state by the blanker of the blanking aperture array chip 212. Then, one shot of each beam is formed by a beam which has been made during a period from becoming beam ON to becoming beam OFF and has passed through the limiting aperture substrate 206. The multiple beams 20 having passed through the limiting aperture substrate 206 are focused by the objective lens 207 so as to be a pattern image of a desired reduction ratio. Then, all of the multiple beams 20 having passed through the limiting aperture substrate 206 are collectively deflected in the same direction by the deflectors 208 and 209 in order to irradiate respective beam irradiation positions on the target object 101. For example, when the XY stage 105 is continuously moving, tracking control is performed by the deflector 208 such that the beam irradiation position follows the movement of the XY stage 105. Ideally, the multiple beams 20 irradiating at a time are aligned at the pitch obtained by multiplying the arrangement pitch of a plurality of holes 22 in the shaping aperture array substrate 203 by the desired reduction ratio described above.

Figure 7:
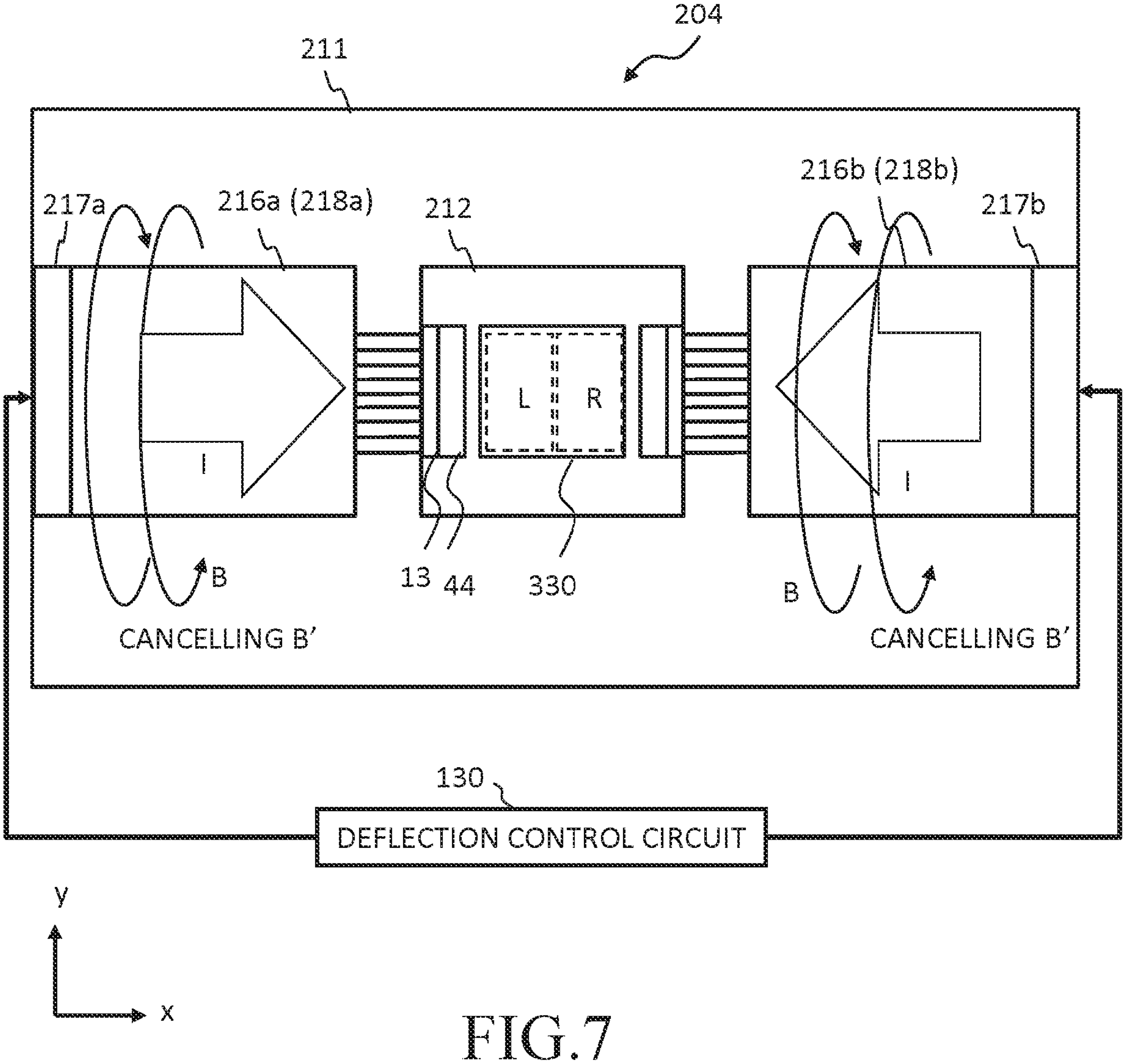
FIG. 7 is a top view of an example of a blanking aperture array mechanism according to the first embodiment.

FIG. 7 is a top view of an example of a blanking aperture array mechanism according to the first embodiment. In FIG. 7, the mounting substrate 211 supports the blanking aperture array chip 212. Specifically, as shown in FIG. 7, the blanking aperture array chip 212 is arranged such that it occludes the opening portion at the center of the mounting substrate 211.

As described above, a plurality of control circuits 41 arranged in an array in the membrane region 330 in the blanking aperture array chip 212 are divided into right and left halves in the x direction to be controlled. At the left half, a plurality of control circuits 41 in the same row are grouped into a plurality of groups. Similarly, at the right half, a plurality of control circuits 41 in the same row are grouped into a plurality of groups. In the blanking aperture array chip 212, the control circuit 44 which controls a plurality of groups in the left half and an interface circuit 13 are disposed outside of and near the peripheral part of the membrane region 330. Similarly, in the blanking aperture array chip 212, the control circuit 44 which controls a plurality of groups in the right half and the interface circuit 13 are disposed outside of and near the peripheral part of the membrane region 330.

In the mounting substrate 211, a power supply plane 216, a cancelling layer 218, and other signal circuits are formed. The power supply plane 216 supplies power to the blanking aperture array chip 212. The power supply plane 216 serves as the power source of a transistor of each logic circuit of voltage Vdd, for example. The cancelling layer 218 is arranged at the upper layer side or lower layer side of the power supply plane 216 in a manner overlapping with the power supply plane 216. It is specifically described below.

On the left side in the x direction of the blanking aperture array chip 212 in the mounting substrate 211, there are formed the layer of a power supply plane (planar power supply) 216*a* which supplies power to a plurality of groups at the left half of the blanking aperture array chip 212, the circuit layer of signal lines (not shown), and an interface circuit 217*a*. The power supply plane 216*a* is connected to the left-side control circuit 44 through the left-side interface circuit 13. The power supply plane 216*a* functions as a power source of the control circuit 44. That is, the power supply plane 216*a* sends a current to the control circuit 44. The circuit layer of signal lines (not shown) is connected to the left-side control circuit 44 through the left-side interface circuit 13. The circuit layer of signal lines outputs a control signal to the control circuit 44. Power and signals are supplied to the layer of the power supply plane 216*a* and the circuit layer of signal lines from the deflection control unit 50 of the deflection control circuit 130 through the interface circuit 217*a*.

Similarly, on the right side in the x direction of the blanking aperture array chip 212 in the mounting substrate 211, there are formed the layer of a power supply plane 216*b* which supplies power to a plurality of groups at the right half of the blanking aperture array chip 212, the circuit layer of signal lines (not shown), and an interface circuit 217*b*. The power supply plane 216*b* is connected to the right-side control circuit 44 through the right-side interface circuit 13. The power supply plane 216*b* functions as a power source of the control circuit 44. That is, the power supply plane 216*b* sends a current to the control circuit 44. The circuit layer of signal lines (not shown) is connected to the right-side control circuit 44 through the right-side interface circuit 13. The circuit layer of signal lines outputs a control signal to the control circuit 44. Power and signals are supplied to the layer of the power supply plane 216*b* and the circuit layer of signal lines from the deflection control unit 50 of the deflection control circuit 130 through the interface circuit 217*b*.

As described above, shift registers are driven to transmit data to respective control circuits 41 in the blanking aperture array chip 212. Power is consumed to drive the shift registers. When beam ON or OFF is performed, current flows in the amplifier 46 in each control circuit 41. For performing these controls at a high speed, a large amount of current may flow at a time. Accordingly, the power supply plane 216 is formed in the mounting substrate 211. At this time, a magnetic field B is generated due to circuit currents flowing in the mounting substrate 211. Thereby, positional deviation of the multiple beams 20 occurs.

Figure 8:
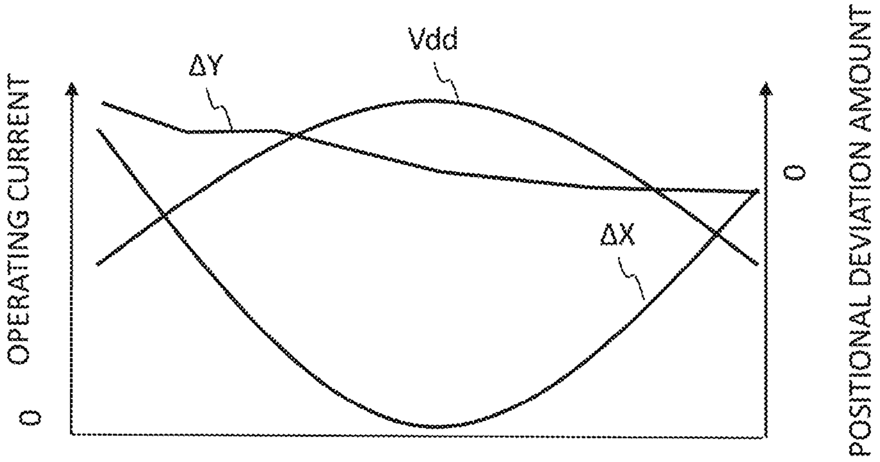
FIG.8 Background Art
FIG. 8 is a graph showing an example of a relationship between an operating current and a beam positional deviation amount according to the first embodiment.

FIG. 8 is a graph showing an example of a relationship between an operating current and a beam positional deviation amount according to the first embodiment. In FIG. 8, the left-ordinate axis represents an operating current and the right-ordinate axis represents a beam positional deviation amount. FIG. 8 shows a result of measuring a beam x-direction positional deviation amount Δx and a beam y-direction positional deviation amount Δy at the time of changing the operating current of the left-side power supply plane 216*a* of voltage Vdd. In the case of FIG. 8, if the operating current increases, along with this, the positional deviation amount Δx increases in the negative direction, for example. In the power supply plane 216*a* shown in FIG. 7, most of the current I flows to the right from the left. In other words, it flows in the x direction, and does not flow in the y direction. Alternatively, if it flows in the y direction, the flow amount remains just small. If the operating current of the left-side power supply plane 216*a* of voltage Vdd is changed, it turns out as shown in FIG. 8 that, according to the change amount of the operating current, the beam positional deviation amount Δx changes with respect to the x direction along which the operating current of the left-side power supply plane 216*a* of voltage Vdd flows. In contrast, with respect to the y direction along which almost no operating current flows, it turns out that the positional deviation amount Δy changes a little. In the mounting substrate 211, there is formed, in addition to the power supply plane used as a power source of the transistor of each logic circuit of voltage Vdd, a power supply plane serving as a power source of the I/O circuit of a signal line. Since the I/O circuit has a small difference from the standby current, its change amount is small. In contrast, each logic circuit of voltage Vdd has a large difference from the standby current. Therefore, the beam position change amount of each logic circuit of voltage Vdd is larger than that of the I/O circuit. Thus, it is turned out that the power supply plane serving as a power source of the I/O circuit of a signal line has a sufficiently small influence compared with the influence given by the power supply plane 216 used as a power source of the transistor of each logic circuit of voltage Vdd.

As described above, if a current flows in the power supply plane 216 of the mounting substrate 211, the magnetic field B is generated. Then, depending on the amount of the current flowing in the power supply plane 216, the size of the generated magnetic field B changes. Depending on the size of the magnetic field B, the positional deviation of a beam passing through the blanking aperture array chip 212 changes. Then, according to the first embodiment, a cancelling plane (cancelling layer) which cancels out the magnetic field B generated by the power supply plane 216 is formed in the mounting substrate 211.

Figure 9:
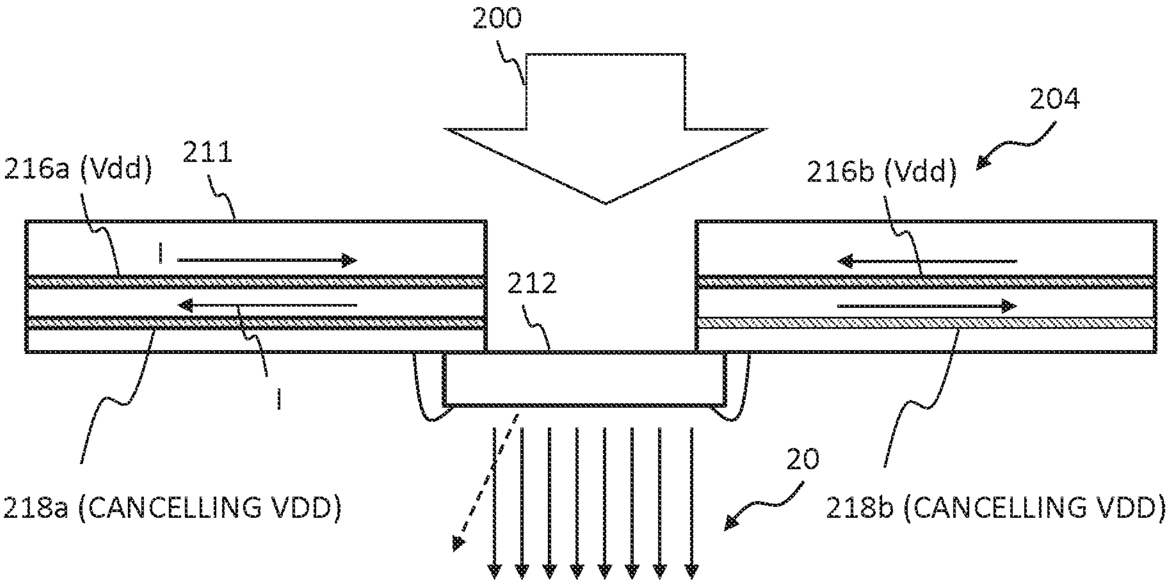
FIG. 9 is an illustration showing an example of a section view of a blanking aperture array mechanism according to the first embodiment.

FIG. 9 is an illustration showing an example of a section view of a blanking aperture array mechanism according to the first embodiment. As shown in FIG. 9, in the mounting substrate 211, the cancelling layer 218*a*, which is on the left side in the x direction, is arranged at the upper layer side or lower layer side of the power supply plane 216*a* in a manner overlapping with the power supply plane 216*a*. That is, when viewed from the above, their regions are overlapped with each other. Similarly, the cancelling layer 218*b*, which is on the right side in the x direction, is arranged at the upper layer side or lower layer side of the power supply plane 216*b* in a manner overlapping with the power supply plane 216*b*. That is, when viewed from the above, their regions are overlapped with each other. In the example of FIG. 9, each cancelling layer 218 is arranged at the lower side of the power supply plane 216.

A current (reverse current) which is in a reverse direction and of the same amount as the current flowing in the power supply plane 216*a* (216*b*) is supplied to the cancelling layer 218*a* (218*b*) from the deflection control circuit 130 (example of a control circuit) of the writing apparatus 100. Specifically, the current measurement unit 52 measures the current flowing to the power supply plane 216*a* (216*b*) from the deflection control unit 50. The current measurement unit 52 inputs an operation result operated in the deflection control unit 50, and calculates the number of beams to be beam ON in the left-side (right-side) beam array, for example. Then, based on the number of beams calculated, a current flowing from the deflection control unit 50 to the power supply plane 216*a* (216*b*) is estimated (calculated). The cancel circuit control unit 54 controls to flow a reverse current, being reverse to the estimated (calculated) current, in the cancelling layer 218*a* (218*b*). By this, the magnetic field B generated by the current flowing in the power supply plane 216*a* (216*b*), and the reverse magnetic field B' generated by the reverse current flowing in the cancelling layer 218*a* (218*b*) become the same intensity magnetic fields in reverse directions. Thereby, the reverse magnetic field B' generated by the reverse current flowing in the cancelling layer 218*a* (218*b*) cancels out the magnetic field B generated by the current flowing in the power supply plane 216*a* (216*b*).

The current to flow in the cancelling layer 218*a* (218*b*) may be, for example, a fluctuating current (active current) which fluctuates per shot, or a fixed current (static current) which is set per stripe region to be described later.

In the case of controlling using a fluctuating current, since its current value fluctuates depending on a writing pattern, it is desirable to flow a reverse current to be corresponding to a current flowing in the power supply plane 216*a* (216*b*) in each shot as described above.

In the case of controlling using a fixed current, for example, it is preferable to obtain a statistic value (e.g., average value) of a current flowing in the power supply plane 216*a* (216*b*) for each stripe region by previously performing a non-irradiation writing process before writing onto the target object 101, and to flow, in actual writing processing, a reverse current, which is reverse to the current of the obtained statistic value, in the cancelling layer 218*a* (218*b*).

Preferably, the cancelling layer 218*a* (218*b*) is formed to have the same shape and area as those of the power supply plane 216*a* (216*b*). By this, the magnetic field B and the reverse magnetic field B' can be completely coincident with reverse directions. In the case of FIG. 7, the power supply plane 216*a* (216*b*) is formed in a rectangular planar shape. In other words, the layer of the power supply plane 216*a* (216*b*) is formed of a solid film of a rectangular conductive material. In that case, it is preferable that the cancelling layer 218*a* (218*b*) is also formed in the same planar shape as that of the power supply plane 216*a* (216*b*). In other words, the cancelling layer 218*a* (218*b*) is formed of a solid film of a rectangular conductive material.

In the case where the power supply plane 216*a* (216*b*) and the cancelling layer 218*a* (218*b*) are rectangularly formed, in the power supply plane 216*a* on the left side shown in FIG. 7, currents flow in parallel from the left to the right when viewed with respect to the paper of FIG. 7. Therefore, in the cancelling layer 218*a*, currents are made to flow in parallel from the right to the left with respect to the paper of FIG. 7. In the power supply plane 216*b* on the right side shown in FIG. 7, currents flow in parallel from the right to the left when viewed with respect to the paper of FIG. 7. Therefore, in the cancelling layer 218*b*, currents are made to flow in parallel from the left to the right with respect to the paper of FIG. 7.

If, because of the configuration of the layer of the mounting substrate 211, it is difficult to form the cancelling layer 218*a* (218*b*) to have the same shape as that of the power supply plane 216*a* (216*b*), a plurality of linear or tabular shape, whose length is longer than width, cancelling layers 218*a* (218*b*) may be arranged in parallel.

Figure 10:
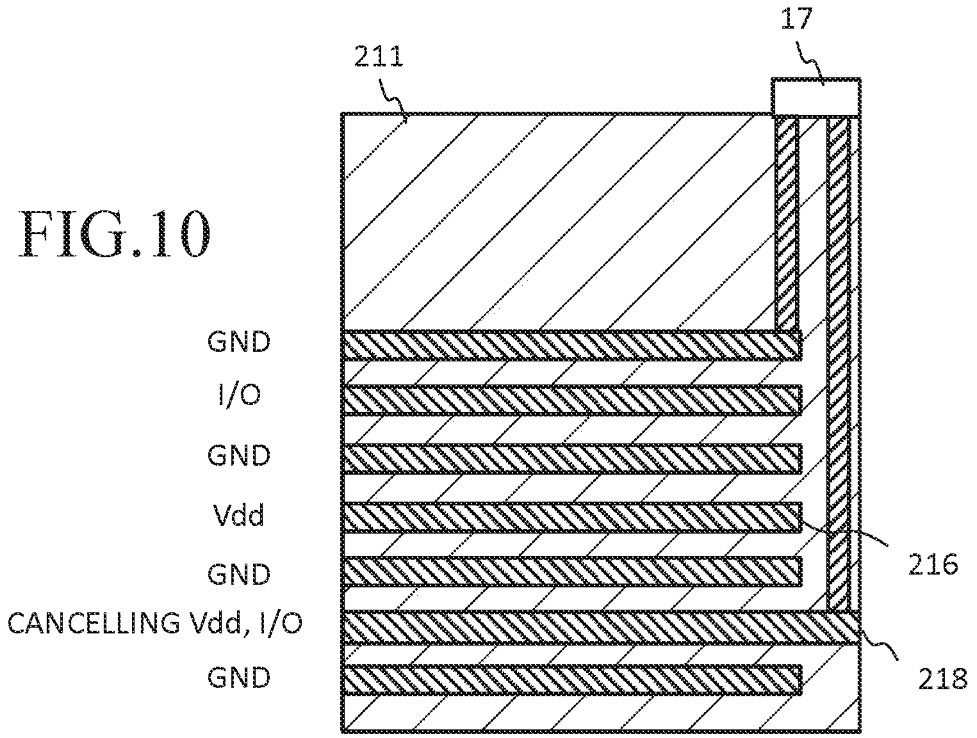
FIG. 10 is an illustration showing an example of each layer formed in a mounting substrate according to the first embodiment.

FIG. 10 is an illustration showing an example of each layer formed in a mounting substrate according to the first embodiment. In the case of FIG. 10, in the mounting substrate 211, in addition to the layer of the power supply plane 216 used as a power source of the transistor of each logic circuit of voltage Vdd and the cancelling layer 218, there are formed a power supply plane layer used as a power source of an I/O circuit, and the grand (GND) layer for each of these layers. The layer of signal wiring is not shown in the figure. As shown in the example of FIG. 10, layers are arranged in order from the lower side: a GND layer, the cancelling layer 218 shown by cancelling Vdd and I/O which together cancel out magnetic fields generated by currents flowing in the power supply plane 216 of voltage Vdd and in the power supply plane layer serving as a power source of an I/O circuit, a GND layer, the layer of the power supply plane 216 of voltage Vdd, a GND layer, the power supply plane layer serving as a power source of an I/O circuit, and a GND layer. An insulating layer is arranged between the respective layers to mutually insulate them. FIG. 10 shows the case where the layer of the power supply plane 216 of voltage Vdd which greatly influences on the magnetic field B, and the cancelling layer 218 are adjacent to each other across the GND layer. In this way, it is acceptable that the layer of the power supply plane 216 and the cancelling layer 218 are arranged at positions close to each other.

Since the current flowing in the power supply plane 216 is consumed in the blanking aperture array chip 212, it is preferable to arrange a resistance 17, having the same load as the blanking aperture array chip 212, between the cancelling layer 218 and a corresponding GND layer. Preferably, the resistance 17 is disposed on the mounting substrate 211, for example. In that case, since the degree of freedom of the size is increased, the resistance 17 can be easily formed compared with formed in the layer or between layers. Conductive contact wiring extending perpendicularly to each layer may be used for connecting between the resistance 17 and the cancelling layer 218 or GND layer. Thereby, it becomes possible to flow a current, equivalent to the current flowing in the power supply plane 216, in a reverse direction in the cancelling layer 218.

Figure 11:
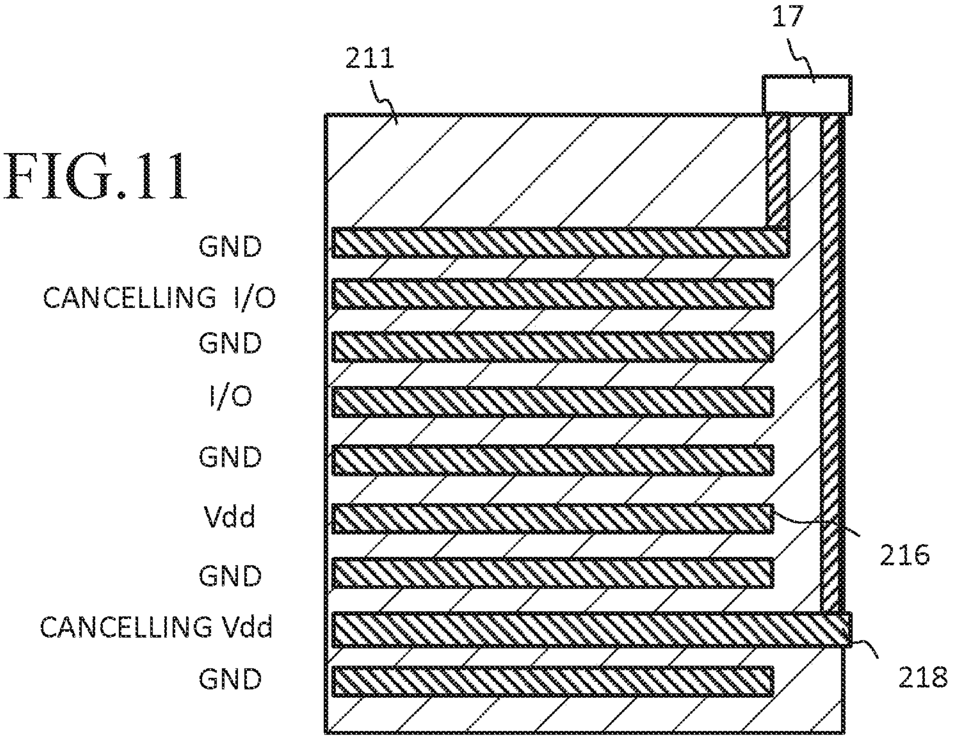
FIG. 11 is an illustration showing another example of each layer formed in a mounting substrate according to the first embodiment.

FIG. 11 is an illustration showing another example of each layer formed in a mounting substrate according to the first embodiment. In the case of FIG. 11, in the mounting substrate 211, there are formed the layer of the power supply plane 216 used as a power source of the transistor of each logic circuit of voltage Vdd, the cancelling layer 218 for the power supply plane 216, a power supply plane layer used as a power source of an I/O circuit, a cancelling layer for a power supply plane layer serving as an I/O power source, and the grand (GND) layer for each of these layers. The layer of signal wiring is not shown in the figure. As shown in the example of FIG. 11, layers are arranged in order from the lower side: a GND layer, the cancelling layer 218 shown by cancelling Vdd which cancels out a magnetic field generated by a current flowing in the power supply plane 216 of voltage Vdd, a GND layer, the layer of the power supply plane 216 of voltage Vdd, a GND layer, the power supply plane layer serving as a power source of an I/O circuit, a GND layer, a cancelling layer shown by a cancelling I/O which cancels out a magnetic field generated by a current flowing in the I/O power supply layer, and a GND layer. An insulating layer is arranged between the respective layers to mutually insulate them. FIG. 11 shows the case where the cancelling layer for the layer of the power supply plane 216 of voltage Vdd, and the cancelling layer for the power supply plane layer used as a power source of the I/O circuit are independently formed with a distance in between. Thus, it is acceptable to have a long distance between two cancelling layers. In the example of FIG. 11, similarly to FIG. 10, the resistance 17 and its contact are arranged. Preferably, in addition to the resistance 17, a resistance (not shown) corresponding to a resistance which consumes a current flowing in the I/O power supply layer is arranged.

Figure 12:
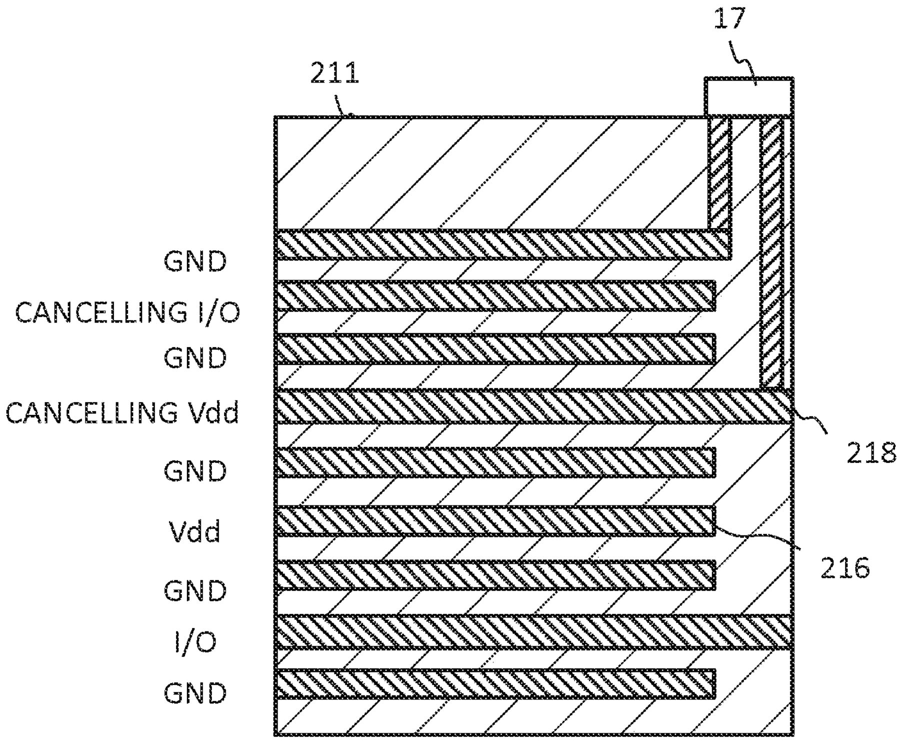
FIG. 12 is an illustration showing another example of each layer formed in a mounting substrate according to the first embodiment.

FIG. 12 is an illustration showing another example of each layer formed in a mounting substrate according to the first embodiment. As shown in the example of FIG. 12, layers are arranged in order from the lower side: a GND layer, a power supply plane layer which serves as a power source of an I/O circuit, a GND layer, the layer of the power supply plane 216 used as a power source of the transistor of each logic circuit of voltage Vdd, a GND layer, the cancelling layer 218 shown by a cancelling Vdd which cancels out the magnetic field generated by a current flowing in the power supply plane 216 of voltage Vdd, a GND layer, the cancelling layer shown by cancelling I/O which cancels out the magnetic field generated by a current flowing in the power supply plane layer used as the power source of an I/O circuit, and a GND layer. The layer of signal wiring is not shown in the figure. An insulating layer is arranged between the respective layers to mutually insulate them. FIG. 12 shows the case where the cancelling layer for the layer of the power supply plane 216 of voltage Vdd, and the cancelling layer for the power supply plane layer used as the power source of the I/O circuit are independently formed adjacent to each other through the GND layer. Thus, it is acceptable to have a short distance between two cancelling layers. In the example of FIG. 12, similarly to FIG. 10, the resistance 17 and its contact are arranged. Preferably, in addition to the resistance 17, a resistance (not shown) corresponding to a resistance which consumes a current flowing in the I/O power supply layer is arranged.

In the above each example, two power supply layers, namely, the layer of the power supply plane 216 serving as a power source of the transistor of each logic circuit of voltage Vdd, and the power supply plane layer serving as a power source of the I/O circuit are described, but it is not limited thereto. Three or more power supply plane layers may be formed. Further, each power supply plane may be formed by use, and a different voltage may be supplied to each of them.

As described above, it is preferable that the cancelling layers are formed according to the number of the power supply planes 216 each used as a power source of the transistor of each logic circuit of voltage Vdd, and the number of the power supply planes each serving as a power source of the I/O circuit. In other words, cancelling layers for the layers of the power supply planes 216 used as the power source of the transistors, in respective logic circuits, of voltage Vdd, and cancelling layers for the power supply plane layers used as the power source of the I/O circuits are formed. However, it is not limited thereto. It is also acceptable to form only the cancelling layer 218 for the power supply plane 216 serving as a power source of the transistor of each logic circuit of voltage Vdd which greatly influences on the magnetic field B.

In the examples described above, a conductive layer of a rectangular planar shape is used as the power supply plane 216, for example, but, it is not limited thereto.

FIG. 13 is a top view of another example of a blanking aperture array mechanism according to the first embodiment. In FIG. 13, the contents other than the shape of the power supply plane 216*a* (216*b*) are the same as those of FIG. 7. FIG. 13 shows the case where the power supply plane 216*a* (216*b*) is formed extending long while changing the direction on the way. The power supply plane 216*a* (216*b*) has a length sufficiently longer than its width. In that case, similar to the shape of the power supply plane 216*a* (216*b*), the cancelling layer 218*a* (218*b*) is formed extending long while changing the direction on the way. In the example of FIG. 13, the power supply plane 216*a* (216*b*) and the cancelling layer 218*a* (218*b*) do not go in a straight line to the blanking aperture array chip 212 from the interface circuit 217*a*. After changing the extending direction outward (up and down direction), they change the direction to be in a direction parallel to the x direction. Further, changing the direction inward (up and down direction), they extend close to the blanking aperture array chip 212. Thus, the power supply plane 216*a* (216*b*) can be various shapes. In the case of FIG. 13, two power supply planes 216*a* (216*b*) on each of the right and left sides are formed in parallel. In order to secure a required amount of current, a plurality of power supply planes 216*a* (216*b*) are formed in parallel. Therefore, preferably, the cancelling layer 218*a* (218*b*) has the same shape as that of the power supply plane 216*a* (216*b*), and further, the number of formed cancelling layers 218*a* (218*b*) is the same as the number of formed power supply planes 216*a* (216*b*).

In the case where the power supply plane 216*a* (216*b*) and the cancelling layer 218*a* (218*b*) are formed extending long while changing the direction on the way, for example, in the upper power supply plane 216*a* of the two power supply planes 216*a* on the left side shown in FIG. 13, currents flow obliquely upward from left to right in parallel inside the plane of the power plane 216*a* when viewed with respect to the paper of FIG. 13, and then, changing the direction on the way, flow from left to right in parallel inside the plane of the power plane 216*a*. Again, changing the direction, they flow obliquely downward from left to right in parallel inside the plane of the power plane 216*a*. Therefore, in the corresponding cancelling layer 218*a*, currents flow obliquely upward from right to left in parallel inside the plane of the cancelling layer 218*a* when viewed with respect to the paper of FIG. 13, and then, changing the direction on the way, flow from right to left in parallel inside the plane of the cancelling layer 218*a*. Again, changing the direction, they flow obliquely downward from right to left in parallel inside the plane of the cancelling layer 218*a*.

Figure 14:
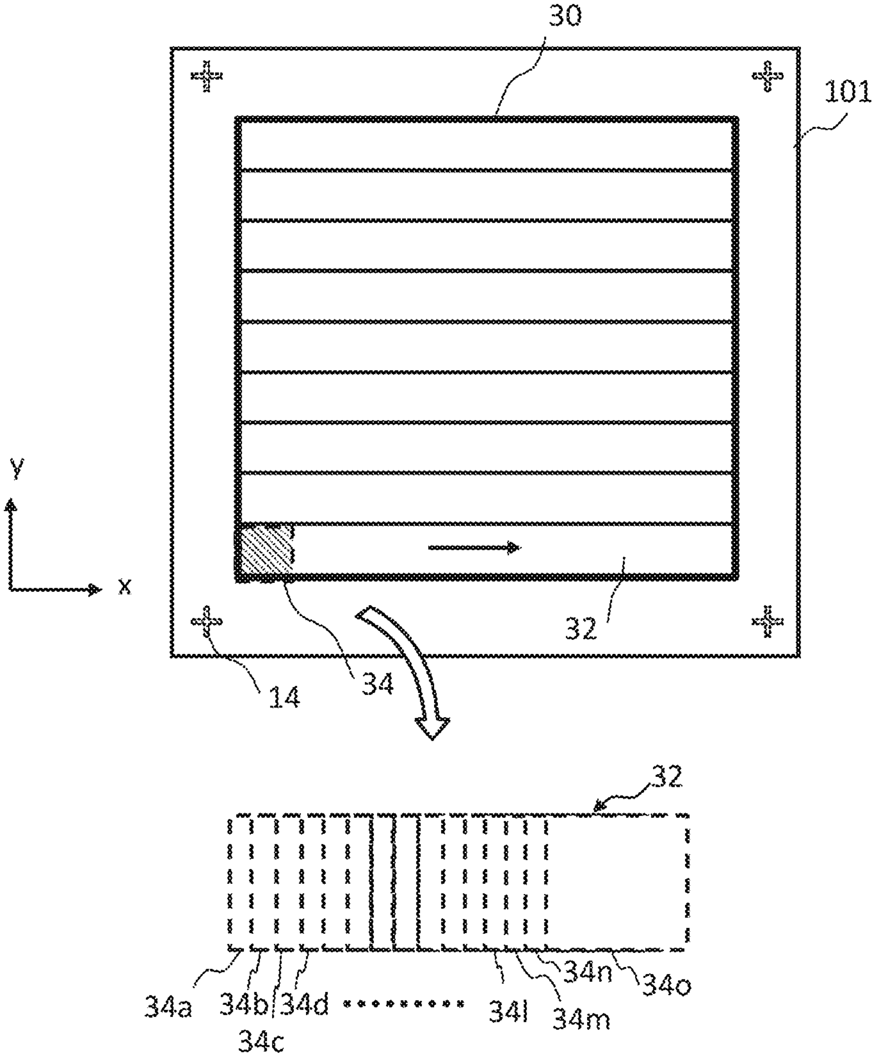
FIG.14 Background Art
FIG. 14 is a conceptual diagram showing an example of a writing operation according to the first embodiment.

FIG. 14 is a conceptual diagram showing an example of a writing operation according to the first embodiment. As shown in FIG. 14, the position of a writing region 30 (bold line) of the target object 101 is defined based on the position of an alignment mark 14. The writing region 30 (bold line) is virtually divided into a plurality of stripe regions 32 by a predetermined width in the y direction, for example. In the case of FIG. 14, the writing region 30 of the target object 101 is divided into a plurality of stripe regions 32 by the width size being substantially the same as the design size of an irradiation region 34 (writing field) which can be irradiated by one irradiation with the multiple beams 20. The x-direction design size of the irradiation region 34 of the multiple beams 20 can be defined by (the number of x-direction beams)×(x-direction beam pitch). The y-direction size of the rectangular irradiation region 34 can be defined by (the number of y-direction beams)×(y-direction beam pitch).

First, the XY stage 105 is moved to make an adjustment such that the irradiation region 34 of the multiple beams 20 is located at the left end, or at a position further left than the left end, of the first stripe region 32, and then writing of the first stripe region 32 is performed. When writing the first stripe region 32, the XY stage 105 is moved, for example, in the −x direction, so that the writing may relatively proceed in the x direction. The XY stage 105 is moved, for example, continuously at a constant speed. After writing the first stripe region 32, the stage position is moved in the −y direction by the width of the stripe region 32.

Next, an adjustment is made such that the irradiation region 34 of the multiple beams 20 is located at the left end, or at a position further left than the left end, of the second stripe region 32. Then, writing of the second stripe region 32 is performed by moving the XY stage 105, for example, in the −x direction to proceed the writing relatively in the x direction.

FIG. 14 shows the case where respective stripe regions 32 are written in the same direction, but, it is not limited thereto. For example, with respect to the stripe region 32 to be written following the stripe region 32 having been written in the x direction, it may be written in the −x direction by moving the XY stage 105 in the x direction, for example. Thus, the stage moving time can be reduced by performing writing while alternately changing the writing direction, which results in reducing the writing time. A plurality of shot patterns maximally up to as many as the number of the holes 22 are formed at a time by one shot of multiple beams 20 having been formed by individually passing through the holes 22 in the shaping aperture array substrate 203.

Although FIG. 14 shows the case where the stage moving for writing each stripe region is performed once for each writing, it is not limited thereto. It is also preferable to perform multiple writing such that the stage moves on the same position a plurality of times. In that case, preferably, the multiple writing is performed while shifting the position in the y direction by the displacement amount of 1/n of the width of the stripe region.

Figure 15:
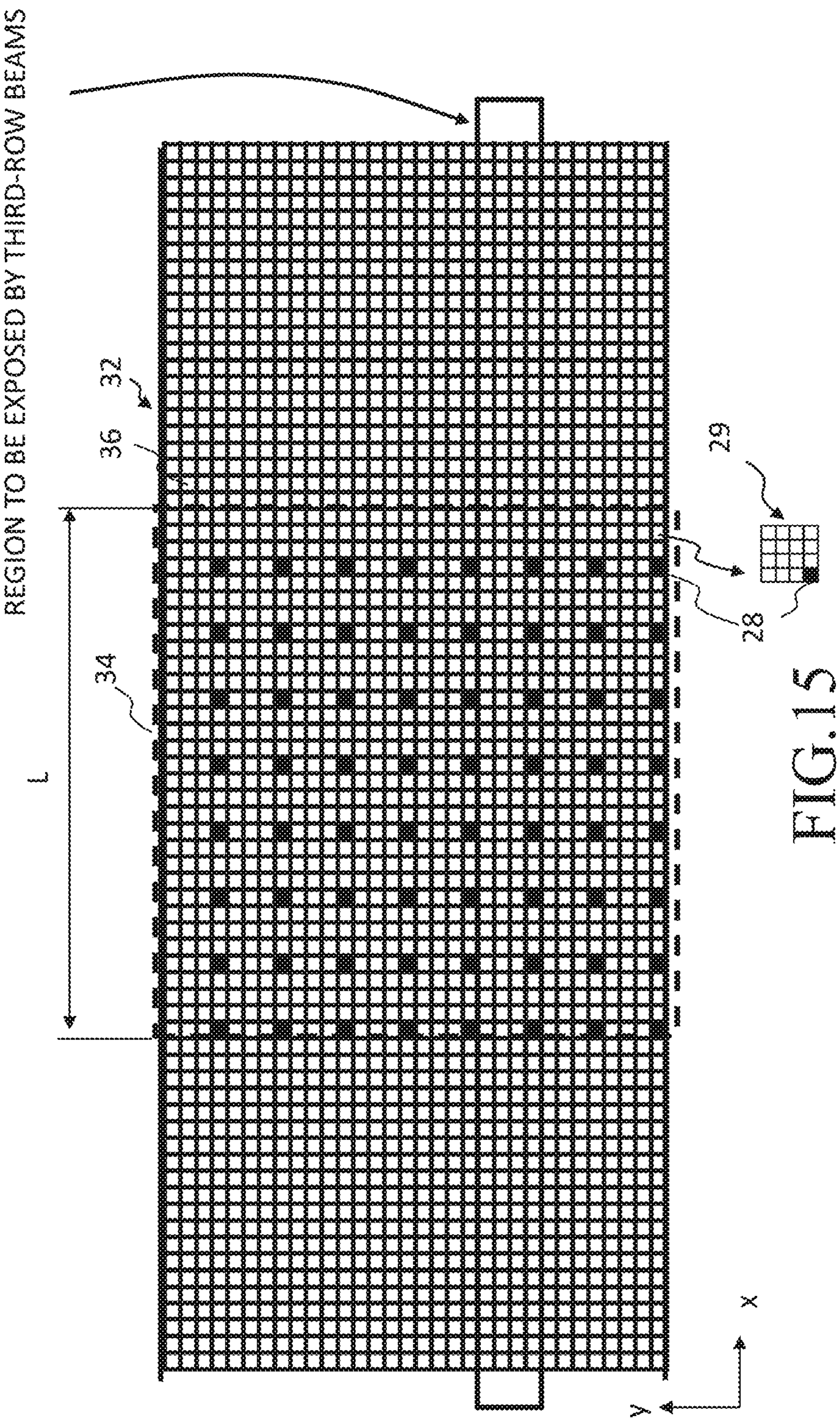
FIG.15 Background Art
FIG. 15 is an illustration showing an example of an irradiation region of multiple beams and a writing target pixel according to the first embodiment.

FIG. 15 is an illustration showing an example of an irradiation region of multiple beams and a pixel to be written (writing target pixel) according to the first embodiment. In FIG. 15, the stripe region 32 is divided into a plurality of mesh regions by the beam size of the multiple beams 20, for example. Each mesh region serves as a writing target pixel 36 (unit irradiation region, irradiation position, or writing position). The size of the writing pixel 36 is not limited to the beam size, and may be any size regardless of the beam size. For example, it may be 1/n (n being an integer of 1 or more) of the beam size. FIG. 15 shows the case where the writing region of the target object 101 is divided, for example, in the y direction, into a plurality of stripe regions 32 by the width size being substantially the same as the size of the irradiation region 34 (writing field) which can be irradiated by one irradiation of the multiple beams 20. The x-direction size of the rectangular, including square, irradiation region 34 can be defined by (the number of x-direction beams)×(beam pitch in the x direction). The y-direction size of the rectangular irradiation region 34 can be defined by (the number of y-direction beams)×(beam pitch in the y direction). FIG. 15 shows the case of multiple beams of 512×512 (rows×columns) being simplified to 8×8 (rows×columns). In the irradiation region 34, there are shown a plurality of pixels 28 (beam writing positions) which can be irradiated with one shot of the multiple beams 20. The pitch between adjacent pixels 28 is the beam pitch of the multiple beams. A sub-irradiation region 29 (pitch cell) is configured by a rectangular, including square, region surrounded by the size of beam pitches in the x and y directions. In the example of FIG. 15, each sub-irradiation region 29 is composed of 4×4 pixels, for example.

In the shot data generation step, first, the shot data generation unit 70 generates shot data for each pixel 36. Specifically, it operates as follows: First, the shot data generation unit 70 reads writing data from the storage device 140, and calculates, for each pixel 36, a pattern area density ρ' in the pixel 36 concerned. This processing is performed for each stripe region 32, for example.

Next, the shot data generation unit 70, first, virtually divides the writing region (here, for example, stripe region 32) into a plurality of proximity mesh regions (mesh regions for proximity effect correction calculation) by a predetermined size. The size of the proximity mesh region is preferably about 1/10 of the influence range of the proximity effect, such as about 1 μm. The shot data generation unit 70 reads writing data from the storage device 140, and calculates, for each proximity mesh region, a pattern area density ρ" of a pattern arranged in the proximity mesh region concerned.

Next, the shot data generation unit 70 calculates, for each proximity mesh region, a proximity effect correction irradiation coefficient Dp(x) (correction dose) for correcting a proximity effect. An unknown proximity effect correction irradiation coefficient Dp(x) can be defined by a threshold value model for proximity effect correction, which is the same as the one used in a conventional method, where a backscatter coefficient η, a dose threshold value Dth of a threshold value model, a pattern area density ρ", and a distribution function g(x) are used.

Next, the shot data generation unit 70 calculates, for each pixel 36, an incident dose D(x) (amount of dose) with which the pixel 36 concerned is irradiated. The incident dose D(x) can be calculated, for example, by multiplying a base dose $D_{base}$ by a proximity effect correction irradiation coefficient Dp and a pattern area density ρ'. The base dose $D_{base}$ can be defined by Dth/(½+η), for example. Thereby, it is possible to obtain an incident dose D(x) for each pixel 36, for which a proximity effect has been corrected, based on layout of a plurality of figure patterns defined by the writing data.

Next, the shot data generation unit 70 calculates an irradiation time for each pixel 36. The irradiation time for each pixel 36 can be obtained by diving an incident dose D(x) of the pixel concerned by a current density J.

In the data processing step, the data processing unit 72 rearranges obtained irradiation time data for each pixel 36 in order of shot, and stores it in the storage device 142. The transmission processing unit 74 transmits, in order of shot, the irradiation time data to the deflection control circuit 130.

In the writing step (S140), under the control of the writing control unit 76, the writing mechanism 150 writes, with the multiple beams 20, a pattern on the target object 101 on the XY stage 105 while moving the XY stage 105. In the multiple beam writing, in parallel with performing the writing processing, the writing mechanism 150 generates shot data for a region in which later writing processing is to be performed. For example, while writing the k-th stripe region 32, shot data for the (k+2) th stripe region 32 is generated in parallel. Repeating this operation, all the stripe regions 32 are written.

Figure 16:
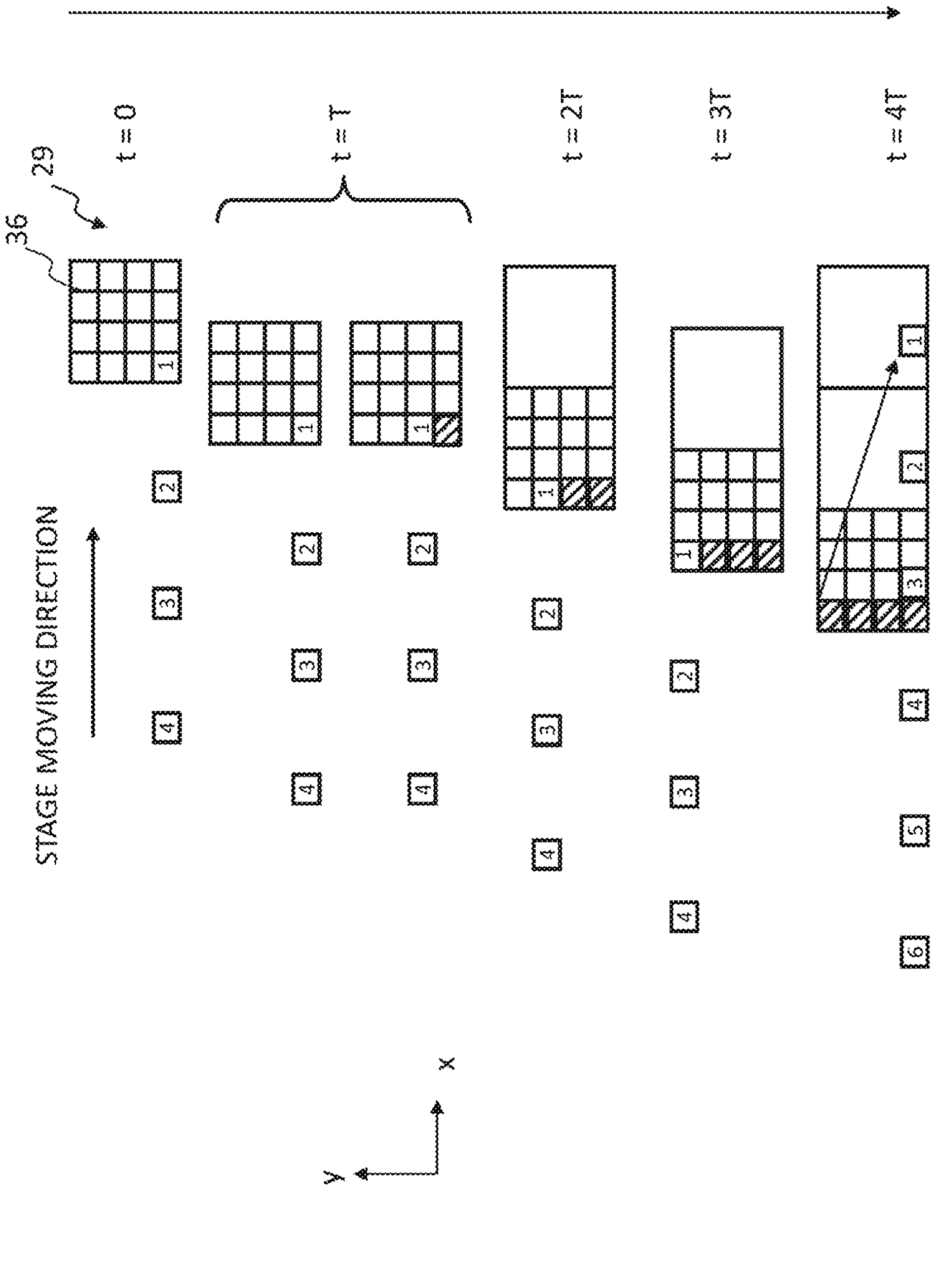
FIG.16 Background Art
FIG. 16 is an illustration explaining an example of a multi-beam writing operation according to the first embodiment.

FIG. 16 is an illustration explaining an example of a multi-beam writing operation according to the first embodiment. FIG. 16 shows the case where the inside of each sub-irradiation region 29, which includes the beam irradiation position of one of the multiple beams 20 and is surrounded with the beam pitch (pitch between beams), is written with four different beams. The example of FIG. 16 shows a writing operation where the XY stage 105 continuously moves at the speed at which the XY stage 105 moves the distance of two beam pitches while a ¼ region, namely the region of 1/(the number of beams used for irradiation), in each sub-irradiation region 29 is written. FIG. 16 shows the case where each sub-irradiation region 29 is composed of 4×4 pixels, for example.

In the writing operation shown in FIG. 16, for example, while the XY stage 105 moves the distance of two beam pitches in the x direction, respective four pixels 36 in the same sub-irradiation region 29 are written (exposed) by applying four shots of the multiple beams 20 at a shot cycle T with shifting the irradiation position (pixel 36) in order by the deflector 209. In order that the relative position between the irradiation region 34 and the target object 101 may not be shifted by the movement of the XY stage 105 while these four pixels 36 are written (exposed), the irradiation region 34 is made to follow the movement of the XY stage 105 by collective deflection of all of the multiple beams 20 by the deflector 208. In other words, a tracking control is performed. After one tracking cycle is completed, tracking is reset to return to the previous (last) tracking starting position. Since writing of the pixels in the first column from the left of each sub-irradiation region 29 has been completed, in the next tracking cycle after resetting the tracking, first, the deflector 209 provides deflection such that the writing position of a beam which is different from that used for the first pixel column is adjusted (shifted) to write the second pixel column from the left still not having been written in each sub-irradiation region 29, for example. By repeating this operation during writing the stripe region 32, as shown in the lower part of FIG. 14, the position of the irradiation region 34 (34*a* to 34*o*) of the multiple beams 20 is sequentially moved (shifted) to perform writing.

During the writing processing, a reverse current controlled for each shot or each stripe flows in the cancelling layer 218*a* (218*b*). By this, the multiple beams 20 can pass through the blanking aperture array chip 212, in the state where the magnetic field B generated by circuit currents flowing in the mounting substrate 211 has been canceled out.

As described above, according to the first embodiment, it is possible to cancel out the magnetic field B generated by circuit currents flowing in the mounting substrate 212 where the blanking aperture array chip 212 through which multiple beams 20 pass is disposed. Accordingly, positional deviation of an electron beam resulting from the magnetic field B can be suppressed or reduced.

Second Embodiment

Although the first embodiment describes the configuration where a magnetic field itself is cancelled out by generating a current reverse to the current flowing in a power supply plane, the configuration for suppressing positional deviation of an electron beam occurring due to a magnetic field generated by a circuit current is not limited to the one described in the first embodiment.

The configuration of the writing apparatus according to the second embodiment is the same as that of FIG. 1. The contents of the second embodiment are the same as those of the first embodiment except what is specifically described below.

Figure 17:
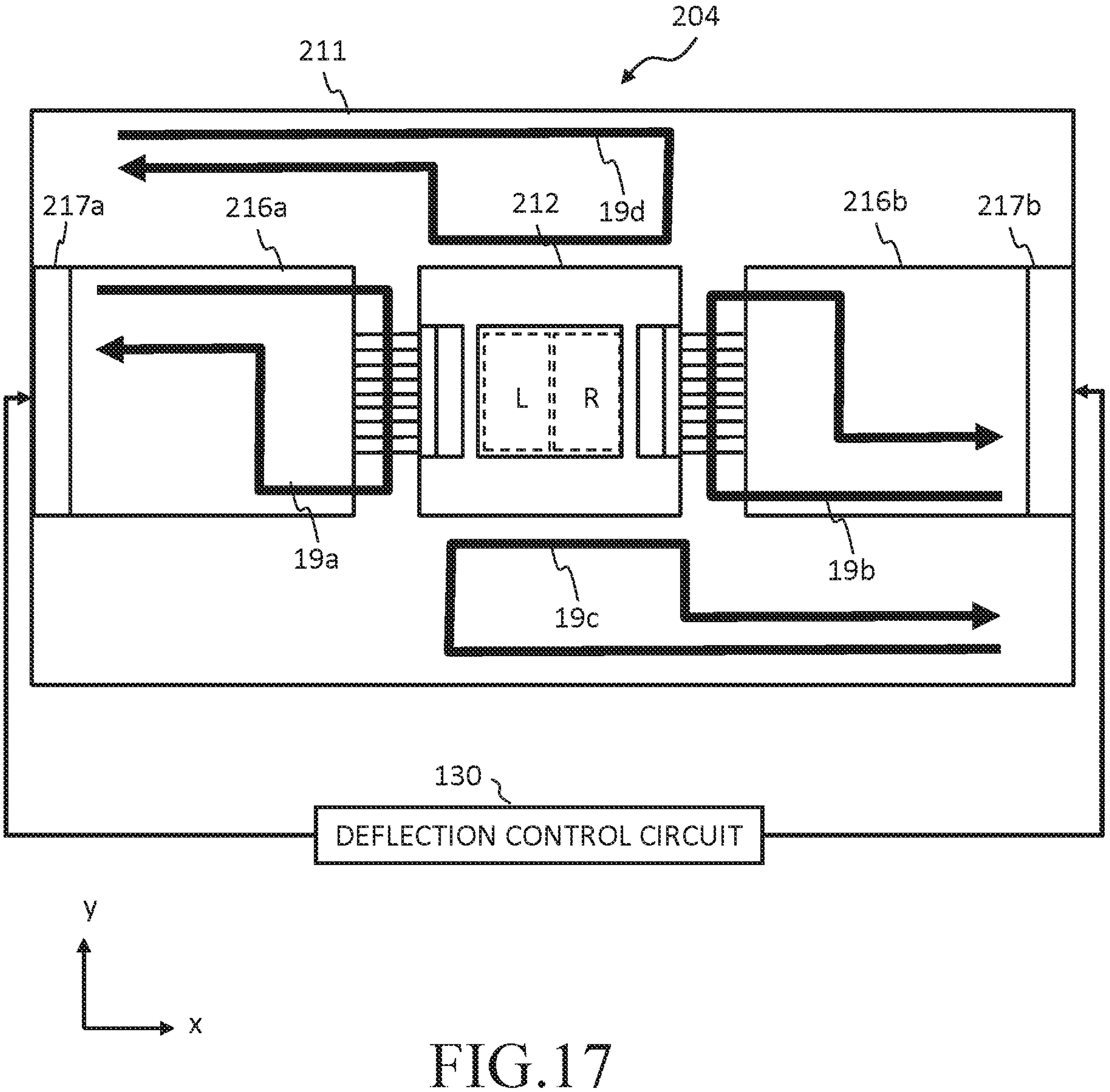
FIG. 17 is a top view of an example of a blanking aperture array mechanism according to a second embodiment.

FIG. 17 is a top view of an example of a blanking aperture array mechanism according to the second embodiment. FIG. 17 is the same as FIG. 7 except that, instead of the cancelling layer 218 formed in the mounting substrate 211 of the blanking aperture array mechanism 204, a plurality of correction coils 19*a*, 19*b*, 19*c*, and 19*d* are arranged in the mounting substrate 211. In FIG. 17, the plurality of correction coils 19*a*, 19*b*, 19*c*, and 19*d* are disposed, at the upper layer side or lower layer side of the power supply plane 216*a* (216*b*), to be in a range where a magnetic field near the blanking aperture array chip 212 can be cancelled out. It is desirable in the second embodiment to arrange the correction coils to be in the direction vertical to the four sides of the blanking aperture array chip 212. However, it is not limited thereto. Instead of the cancelling layer 218 described with reference to FIGS. 10 to 12, a layer of the correction coil may be formed. In the second embodiment, the resistance 17 and the contact for connecting the resistance 17 to the cancelling layer shown in FIGS. 10 to 12 are not needed, nor is the GND layer for the cancelling layer.

FIG. 17 shows the case where the blanking aperture array chip 212 is surrounded by the four correction coils 19*a*, 19*b*, 19*c*, and 19*d*, for example. The number of the correction coils such as 19*a*, 19*b*, 19*c*, and 19*d* is not limited to four, and may be more than four. For easy controlling, the number of the correction coils is preferably an integer multiple of four. In the plurality of correction coils 19*a*, 19*b*, 19*c*, and 19*d*, some of the correction coils, 19*a* and 19*b*, are formed partially overlapping with the power supply planes 216*a* and 216*b*.

In the case where the blanking aperture array chip 212 is surrounded by the four correction coils 19*a*, 19*b*, 19*c*, and 19*d*, it is preferable that wiring of each coil is individually arranged along one of the four peripheral sides of the blanking aperture array chip 212. Thereby, a fixed magnetic field can be acted on each peripheral side.

The plurality of correction coils 19*a*, 19*b*, 19*c*, and 19*d* are independently controlled by the cancel circuit control unit 54.

The power supply plane 216 and the cancelling layer 218 are formed in the mounting substrate 211. The power supply plane 216 supplies power to the blanking aperture array chip 212. As described above, the magnetic field B is generated by a circuit current flowing in the mounting substrate 211. Therefore, positional deviation of the multiple beams 20 occurs.

According to the second embodiment, instead of cancelling out the magnetic field B itself, positional deviation of the multiple beams 20 is directly corrected by a magnetic field generated due to currents to flow in the plurality of correction coils 19*a*, 19*b*, 19*c*, and 19*d*.

In order that the position of the multiple beams 20 may not deviate by a magnetic field generated due to a current flowing in the power supply plane 216*a* (216*b*), the deflection control circuit 130 (an example of a control circuit) of the writing apparatus 100 supplies a current to the plurality of correction coils 19*a*, 19*b*, 19*c*, and 19*d*.

Specifically, the current measurement unit 52 measures a current flowing from the deflection control unit 50 to the power supply plane 216*a* (216*b*). The current measurement unit 52 inputs a calculation result calculated by the deflection control unit 50, and calculates the number of beams which are to be ON in the beam array at the left side (or right side). Based on the calculated number of beams, the current measurement unit 52 estimates (calculates) a current to flow from the deflection control unit 50 to the power supply plane 216*a* (216*b*). Then, the cancel circuit control unit 54 controls to individually flow, in each correction coil 19, a current for correcting positional deviation of the multiple beams 20 which occurs by the magnetic field B generated by the estimated (calculated) current. By this, the positional deviation of the multiple beams 20 which occurs by the magnetic field B generated by the current flowing in the power supply plane 216*a* (216*b*) is corrected by the magnetic field B' generated by the currents flowing in the plurality of correction coils 19*a*, 19*b*, 19*c*, and 19*d*. A relational equation or a relational table for the size of a current flowing in the power supply plane 216*a* (216*b*), the amount of a positional deviation of the multiple beams 20, and the direction and size of a current to flow in each correction coil 19 for correcting the positional deviation is obtained in advance by an experiment or simulation.

The current to flow in the plurality of correction coils 19*a*, 19*b*, 19*c*, and 19*d* is variably controlled for each shot or each stripe region 32. In the case of performing the control for each stripe region 32, as described above, for example, it is acceptable to obtain a statistic value (e.g., average value) of a current flowing in the power supply plane 216*a* (216*b*) for each stripe region by previously executing a non-irradiation writing process before writing onto the target object 101, and to control, in actual writing processing, each correction coil 19 by a current in direction and size to flow in each correction coil 19 for correcting a positional deviation amount which corresponds to the current of the obtained statistic value.

Then, as writing processing similar to the first embodiment, the shot data generation step, the data processing step and the writing step described above are performed. In the writing step, a current individually controlled for each shot or each stripe is made to flow in each correction coil 19. Thereby, the multiple beams 20 can pass through the blanking aperture array chip 212 in the state where positional deviation has been corrected.

As described above, according to the second embodiment, it is possible to correct positional deviation of an electron beam (multiple beams 20) resulting from a magnetic field generated by a circuit current flowing in the mounting substrate 211 where a blanking aperture array chip 212 through which the multiple beams 20 pass is arranged.

Embodiments have been explained referring to specific examples described above. However, the present invention is not limited to these specific examples. In the above Embodiments, it is designed that, at the upper and lower sides of the power supply layer, GND layers are arranged serving as current return paths to cancel out an electromagnetic noise generated by the power supply layer. Since the electromagnetic noise cannot be completely cancelled out, it is intended to further reduce the electromagnetic noise by arranging a cancelling layer for exclusive use for magnetic field cancellation, and a magnetic field cancelling coil, and therefore, beam positional deviation can be suppressed.

While the apparatus configuration, control method, and others not directly necessary for explaining the present invention are not described, some or all of them can be appropriately selected and used on a case-by-case basis when needed. For example, although description of the configuration of the control unit for controlling the writing apparatus 100 is omitted, it should be understood that some or all of the configuration of the control unit can be selected and used appropriately when necessary.

Further, any blanking aperture array mechanism and writing apparatus that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A blanking aperture array mechanism comprising:
- a blanking aperture array chip configured to include a plurality of blankers which, at incidence of multiple beams, individually switch a state between "beam ON" and "beam OFF" of the multiple beams; and
- a mounting substrate configured to support the blanking aperture array chip, and to include
  - a power supply plane configured to supply power to the blanking aperture array chip, and
  - a cancelling layer arranged at one of an upper layer side and a lower layer side of the power supply plane in a manner overlapping with the power supply plane, and configured to cancel out a magnetic field generated by the power supply plane.

2. The mechanism according to claim 1, wherein the cancelling layer is formed to have a same shape and area as those of the power supply plane.

3. The mechanism according to claim 1, wherein the cancelling layer is formed to be planar.

4. The mechanism according to claim 1, wherein the cancelling layer is formed extending long while changing a direction on a way.

5. The mechanism according to claim 1, wherein
- the blanking aperture array mechanism is mounted in a writing apparatus which writes a pattern on a target object, and
- a reverse current which is correspondingly reverse to a current flowing in the power supply plane is supplied to the cancelling layer from a control circuit of the writing apparatus.

6. A blanking aperture array mechanism comprising:
- a blanking aperture array chip configured to include a plurality of blankers which, at incidence of multiple beams, individually switch a state between "beam ON" and "beam OFF" of the multiple beams; and
- a mounting substrate configured to support the blanking aperture array chip and to include
  - a power supply plane configured to supply power to the blanking aperture array chip, and
  - a plurality of correction coils arranged at one of an upper layer side and a lower layer side of the power supply plane and near the blanking aperture array chip, and configured to correct positional deviation of the multiple beams.

7. The mechanism according to claim 6, wherein the plurality of correction coils surround the blanking aperture array chip.

8. The mechanism according to claim 6, wherein the plurality of correction coils are formed such that wiring of each of the plurality of correction coils is individually arranged along one of four peripheral sides of the blanking aperture array chip.

9. A writing apparatus comprising:

a stage configured to mount thereon a target object to be written;

a blanking aperture array mechanism according to claim 1;

a limiting aperture substrate configured to block a beam in an OFF state in multiple beams having passed through the blanking aperture array mechanism; and an objective lens configured to lead the multiple beams having passed through the limiting aperture substrate to the target object.

10. A writing apparatus comprising:

a stage configured to mount thereon a target object to be written;

a blanking aperture array mechanism according to claim 6;

a limiting aperture substrate configured to block a beam in an OFF state in multiple beams having passed through the blanking aperture array mechanism; and an objective lens configured to lead the multiple beams having passed through the limiting aperture substrate to the target object.

* * * * *